(12) United States Patent
McGarry

(10) Patent No.: US 10,630,960 B2
(45) Date of Patent: *Apr. 21, 2020

(54) MACHINE VISION 3D LINE SCAN IMAGE ACQUISITION AND PROCESSING

(71) Applicant: Cognex Corporation, Natick, MA (US)

(72) Inventor: John McGarry, San Diego, CA (US)

(73) Assignee: Cognex Corporation, Natick, MA (US)

( * ) Notice: Subject to any disclaimer, the term of this patent is extended or adjusted under 35 U.S.C. 154(b) by 478 days.

This patent is subject to a terminal disclaimer.

(21) Appl. No.: 15/276,429

(22) Filed: Sep. 26, 2016

(65) Prior Publication Data

US 2017/0085862 A1    Mar. 23, 2017

Related U.S. Application Data

(63) Continuation of application No. 13/847,939, filed on Mar. 20, 2013, now Pat. No. 9,453,730.

(51) Int. Cl.
| | |
|---|---|
| *H04N 13/207* | (2018.01) |
| *G01C 11/02* | (2006.01) |
| *H04N 5/378* | (2011.01) |
| *H04N 5/369* | (2011.01) |
| *H04N 13/254* | (2018.01) |
| *H04N 5/335* | (2011.01) |
| *H03M 7/30* | (2006.01) |

(52) U.S. Cl.
CPC ......... *H04N 13/207* (2018.05); *G01C 11/025* (2013.01); *H03M 7/3059* (2013.01); *H03M 7/3062* (2013.01); *H04N 5/335* (2013.01); *H04N 5/369* (2013.01); *H04N 5/378* (2013.01); *H04N 13/254* (2018.05)

(58) Field of Classification Search
CPC .................... H03M 7/3059; H03M 7/3062
See application file for complete search history.

(56) References Cited

U.S. PATENT DOCUMENTS

| | | |
|---|---|---|
| 5,105,276 A | 4/1992 | Schrock |
| 8,199,244 B2 | 6/2012 | Baraniuk |
| 2002/0085107 A1 | 7/2002 | Chen et al. |
| 2005/0092894 A1* | 5/2005 | Fossum ............ H01L 27/14609 250/208.1 |
| 2010/0073294 A1 | 3/2010 | Kim et al. |
| 2010/0245955 A1 | 9/2010 | Yamakawa et al. |

(Continued)

FOREIGN PATENT DOCUMENTS

| | | |
|---|---|---|
| CN | 101287064 A | 10/2008 |
| CN | 101291389 A | 10/2008 |

(Continued)

OTHER PUBLICATIONS

Chinese Application No. 201410103031.X, First Office Action, dated Dec. 5, 2016, 11 pages.

(Continued)

*Primary Examiner* — Brian T Pendleton
*Assistant Examiner* — Kyle M Lotfi
(74) *Attorney, Agent, or Firm* — Fish & Richardson P.C.

(57) ABSTRACT

A machine vision system may perform compressive sensing by aggregating signals from multiple pixels. The aggregation of signals may be based on a sampling function. The sampling function may be formed of a product of a random basis, which may be sparse, and a filtering function.

15 Claims, 10 Drawing Sheets

(56) References Cited

U.S. PATENT DOCUMENTS

| | | | |
|---|---|---|---|
| 2012/0038786 | A1 | 2/2012 | Kelly et al. |
| 2012/0162457 | A1 | 6/2012 | Veeraraghavan |
| 2012/0281126 | A1* | 11/2012 | Fossum .............. H04N 5/23251 348/302 |
| 2013/0119438 | A1 | 5/2013 | Kim et al. |
| 2014/0231620 | A1 | 4/2014 | Oike et al. |
| 2015/0030234 | A1* | 1/2015 | Lenseigne ............... G06T 7/507 382/154 |

FOREIGN PATENT DOCUMENTS

| | | |
|---|---|---|
| CN | 102708781 A | 10/2012 |
| CN | 103548335 A | 1/2014 |
| JP | 05-322539 | 12/1993 |
| JP | 2005354568 A1 | 12/2005 |
| WO | WO2009035785 A1 | 3/2009 |
| WO | WO2012058229 | 5/2012 |
| WO | WO2012132670 A1 | 7/2014 |

OTHER PUBLICATIONS

Dubois et al., "VLSI Design of a High-Speed CMOS Image Sensor With In-Situ 2D Programmable Processing", 14th European Signal Processing Conference (EUSIPCO 2006), Sep. 2006, 5 pages.

Japanese Patent Application No. 2016-069680, Notice of Reason for Refusal dated Jan. 23, 2018, 4 pages.

Baraniuk et al., "Exponential decay of reconstruction error from binary measurements of sparse signals", arXiv:1407.8246v1 [cs.IT] Aug. 1, 2014, pp. 1-27.

Boufounos et al., "1-Bit Compressive Sensing", Information Sciences and Systems, CISS, 42nd Annual Conference on Mar. 19-21, 2008, pp. 16-21, IEEE.

Candes et al., "Near-Optimal Signal Recovery From Random Projections: Universal Encoding Strategies?", IEEE Transactions on Information Theory, vol. 52, No. 12, Dec. 2006.

Candes et al., "An Introduction to Compressive Sampling", IEEE Signal Processing Magazine, Mar. 2008, pp. 21-30.

DALSA Technology with Vision, "Application Note, Line Scan Imaging Basics", 03-32-00541-00, pp. 1-11.

David L. Donoho, "Compressed Sensing", IEEE Transactions on Information Theory, vol. 52, No. 4, Apr. 2006, pp. 1289-1306.

Dubois et al., "A 10000 fps CMOS Sensor With Massively Parallel Image Processing", IEEE Journal of Solid State Circuits, Institute of Electrical and Electronics Engineers, vol. 43, No. 3, pp. 706-717, Mar. 2008.

Extended European Search Report, European Patent Application No. 14160933.9, dated Jan. 22, 2015, 9 pages.

Jacques et al., "CMOS Compressed Imaging by Random Convolution", 4 pages.

Jacques et al., "Robust 1-Bit Compressive Sensing via Binary Stable Embeddings of Sparse Vectors", URL: http://arxiv.org/abs/1104.3160v2, pp. 1-40, Feb. 15, 2012.

Knudson et al., "One-bit compressive sensing with norm estimation", arXiv:1404.6863v1 [stat.ML], Apr. 28, 2014, pp. 1-15.

Majidzadeh et al., "A (256x256) Pixel 76.7mW CMOS Imager/Compressor Based on Real-Time In-Pixel Compressive Sensing", IEEE 2010, pp. 2956-2959.

Oike et al., "CMOS Image Sensor With Per-Column ADC and Programmable Compressed Sensing", IEEE Journal of Solid-State Circuits, vol. 48, No. 1, Jan. 2013, pp. 318-328.

Japanese Patent Application No. 2014-055305, Notice of Reasons for Refusal, dated Mar. 31, 2015, 9 pages.

European Application No. 17174525.0, Extended European Search Report, dated Nov. 21, 2017, 9 pages.

International Application No. PCT/US2017/013328, Notification of Transmittal of the International Search Report and the Written Opinion of the International Searching Authority, dated Apr. 7, 2017, 16 pages.

Dadkhah et al., "Block-Based Compressive Sensing in a CMOS Image Sensor", IEEE Sensors Journal, Jan. 1, 2013, pp. 1-12.

Nilchi et al., "Focal-Plane Algorithmically-Multiplying CMOS Computational Image Sensor", IEEE Journal of Solid-State Circuits, Jun. 1, 2009, pp. 1829-1839.

Extended European Search Report, European Patent Application No. 18211832.3, dated Jan. 28, 2019, 10 pages.

Asada and Oike, "High-Definition, Real-Time 3D Imaging System Using the Light-Section Method", Image Lab (Gazo Rabo), vol. 15, No. 7, pp. 40-44, 2004.

Japanese Patent Application No. 2018-109639, Notice of Allowance dated Jan. 21, 2020, 3 pages.

\* cited by examiner

MACHINE VISION 3D LINE SCAN IMAGE ACQUISITION AND PROCESSING

CROSS-REFERENCE TO RELATED APPLICATIONS

This application is a continuation application of and claims priority to U.S. application Ser. No. 13/847,939, filed on Mar. 20, 2013 (now U.S. Pat. No. 9,453,730).

BACKGROUND OF THE INVENTION

The present invention relates generally to machine vision, and more particularly to machine vision systems for sensing depth information of a scene illuminated by a plane of light.

A well-known method for acquiring 3D range images includes steps of: providing a light source with line generating optics to illuminate a single plane of a scene, positioning a digital camera to view the light plane such that objects illuminated by the light source appear in the optical image formed by the camera lens, capturing a digital image of the scene, processing the digital image to extract the image coordinates of points in the scene illuminated by the light source, and processing the image coordinates according to the triangulation geometry of the optical system to form a set of physical coordinates suitable for measurement of objects in the scene.

A major limitation associated with such a conventional machine vision process is that a 2-dimensional intensity image of substantial size must be captured by the digital camera for each and every line of physical coordinates formed by the system. This can make the time to capture the 3D image of a scene as much as 100 times longer than the time required to acquire an intensity image of the same size scene, thereby rendering laser-line based 3D image formation methods too slow for many industrial machine-vision applications.

BRIEF SUMMARY OF THE INVENTION

Aspects of the invention provide machine vision systems and methods applicable to location of the intersection of a plane(s) of illumination with an object(s) in a scene.

Aspects of the present invention introduce methods and apparatus that make possible the practical realization of a vision system having significant advantages over conventional vision systems in the stated application domain. In some aspects the invention performs substantially the same function as the conventional vision systems of FIG. 1a, and FIG. 1b i.e. to extract parameters associated with the image features of the curve formed of the intersection of a plane of illumination with objects of interest in a physical scene, but performs the functions, including computations, in such a way as to realize a throughput advantage in actual implementation.

In one aspect the invention provides a method useful in determining information of an image, comprising: accumulating a first pixel signal based on incoming light energy for each of a plurality of pixel elements of a pixel array, the pixel elements each including a light sensor, the first pixel signals indicative of an image of a scene; and obtaining information of a measurement indicative of the image of the scene by: applying sets of control signals to rows of the pixel elements, pixel elements of each row sharing common control signals, each of the sets of control signals being substantially uncorrelated with each other, each of the sets of control signals being representative of a different vector of a matrix comprising a product of a random basis function and a filtering function having a frequency response tuned to desired spatial frequencies of interest in an expected image signal, for each set of control signals, aggregating, in accordance with the control signals, output signals based on the first pixel signals for columns of pixel elements, and digitizing each of the aggregated output signals of the columns of the pixel elements.

In accord with some such aspects accumulation of the first pixel signals begins prior to application of the sets of control signals and continues throughout application of the sets of control signals. In accord with some such aspects accumulation of the first pixel signals begins prior to application of the sets of control signals, and application of the sets of control signals temporarily interrupted, and resetting and recommencing accumulation of the first pixel signals occurs during the interruption. In accord with some such aspects aggregating, in accordance with the control signals, output signals based on the first pixel signals for columns of pixel elements, comprises, for each column of pixel elements, coupling first selected ones of the first pixel signals to a first column output line for that column and coupling second selected ones of the first pixel signals to a second column output line for that column, the first selected ones of the first pixel signals and the second selected ones of the first pixel signals being determined by the control signals. In accord with some such aspects digitizing each of the aggregated output signals of the columns of the pixel elements comprises, for each of the columns of the pixel elements, comparing signals of the first column output line and the second column output line. In accord with some such aspects the first pixel signals comprise voltage signals and wherein the output signals comprise current signals. In accord with some such aspects the pixel array includes $N_1$ rows of pixel elements, $N_2$ columns of pixel elements, and M sets of control signals are applied to rows of the pixel elements to form a measurement indicative of the image of the scene, M much less than $N_1$. In accord with some such aspects the filtering function is based on a central difference approximation. In accord with some such aspects the digitized aggregated output signals are written to a buffer, the buffer storing a measurement indicative of the image of the scene. In accord with some such aspects an estimate is determined by forming a product of a transpose of the random basis function and the measurement, the estimate is refined, and edges of lines are located in the estimate.

In another aspect the invention provides a method useful in determining information of an image, comprising: accumulating a first pixel signal based on incoming light energy for each of a plurality of pixel elements of a pixel array, the pixel elements each including a light sensor; and obtaining information of a measurement indicative of the image of the scene by: applying sets of control signals to rows of the pixel elements, pixel elements of each row being grouped in pixel subsets each including a plurality of pixels of that row, pixel elements in each row belonging to each pixel subset sharing common control signals, each of the sets of control signals being substantially uncorrelated with each other, for each set of control signals, aggregating, in accordance with the control signals, output signals of columns of pixel elements, the output signals being based on the first pixel signals, and digitizing each of the aggregated output signals of the columns of the pixel elements.

In accord with some such aspects for each row, pixel elements in a first pixel subset are separated by pixel elements of at least one other pixel subset. In accord with some such aspects each column of pixel elements includes only pixel elements belonging to the same pixel subset. In accord with some such aspects the sets of control signals comprise groups of sets of control signals, each group of sets of control signals based on a different sampling function. In accord with some such aspects each sampling function is substantially uncorrelated to the other sampling functions. In accord with some such aspects pixel elements in each subset receive control signals based on different sampling functions. In accord with some such aspects the control signals are based on at least nine different sampling functions, with control signals based on at least three different sampling functions being applied over a first time period, control signals based on at least three other different sampling functions being applied over a second time period, and control signals based on at least another three other different sampling functions being applied over a third time period. In accord with some such aspects each sampling function comprises a product of a random basis function and a filtering function having a frequency response tuned to desired spatial frequencies of interest in an expected image signal. In accord with some such aspects accumulation of the first pixel signals occurs asynchronously with respect to application of the sets of control signals. In accord with some such aspects accumulation of the first pixel signals occurs synchronously with respect to application of the sets of control signals. In accord with some such aspects aggregating, in accordance with the control signals, output signals based on the first pixel signals for columns of pixel elements, comprises, for each column of pixel elements, coupling first selected ones of the first pixel signals to a first column output line for that column and coupling second selected ones of the first pixel signals to a second column output line for that column, the first selected ones of the first pixel signals and the second selected ones of the first pixel signals being determined by the control signals. In accord with some such aspects digitizing each of the aggregated output signals of the columns of the pixel elements comprises, for each of the columns of the pixel elements, comparing signals of the first column output line and the second column output line. In accord with some such aspects the first pixel signals comprise voltage signals and wherein the output signals comprise current signals. In accord with some such aspects the pixel array includes $N_1$ rows of pixel elements, $N_2$ columns of pixel elements, and M sets of control signals are based on each sampling function, M much less than $N_1$.

In another aspect the invention provides a method useful in determining information of an image, comprising: providing an image sensor comprising: a pixel array including a plurality of pixel elements partitioned into rows and columns, each of the pixel elements comprising a light sensor, pixel elements in each row belonging to one of a plurality of different sets, the pixel elements in each row belonging to each set having common couplings for receiving control signals for pixel elements of that set for that row, pixel elements in each column of pixel elements having common couplings for providing a column output signal for that column, contributions of the pixel elements to the column output signal being dependent on the control signals and light energy accumulated by the pixel elements; and an array of digitizers coupled in one-to-one correspondence with columns of the pixel array, the digitizers coupled so as to receive the column output signals from their corresponding column of the pixel array; obtaining a measurement of image intensity signals on the pixel elements by: applying row input signal vectors to the control lines of the pixel array, a different row input signal vector being applied for each set, each row input signal vector being of one of a subset of a set of all possible row input signal vectors that is substantially uncorrelated with all previously applied row input signal vectors for a current frame time, reading outputs of the array of digitizers, and repeating, for a plurality of times, application of the row input signal vectors and reading outputs of the array of digitizers.

In accord with some such aspects the row input signal vectors are based on vectors of a plurality of sampling functions. In accord with some such aspects each sampling function comprises a product of a random basis function and a filtering function having a frequency response tuned to desired spatial frequencies of interest in an expected image signal.

In another aspect the invention provides an image sensor comprising: a pixel array including a plurality of pixel elements partitioned into rows and columns, each of the pixel elements comprising a light sensor; pixel elements in each row belonging to one of a plurality of different sets, the pixel elements in each row belonging to each set having common couplings for receiving control signals for pixel elements of that set for that row; pixel elements in each column of pixel elements having common couplings for providing each of a first column output signal and a second column output signal for that column, contributions of the pixel elements to the column output signals being dependent on the control signals and light energy accumulated by the pixel elements; and an array of digitizers coupled in one-to-one correspondence with columns of the pixel array, the digitizers coupled so as to receive an indication of the column output signals from their corresponding column of the pixel array.

In accord with some such aspects a first storage element is about one side of the pixel array for storing information for use in generating some of the control signals and a second storage element is about another side of the pixel array for storing information for use in generating others of the control signals. In accord with some such aspects the first storage element and the second storage element each comprise an array of storage cells, each storage cell including storage for at least two bits of information. In accord with some such aspects the common couplings for receiving control signals of each pixel element includes a first coupling for receiving a signal indicative of a first of the two bits and a second coupling for receiving a signal indicative of a second of the two bits. In accord with some such aspects digitizer is coupled to columns of the pixel array by a current conveyor and a current limiter.

These and other aspects of the invention are more fully comprehended upon review of this disclosure.

DETAILED DESCRIPTION

Figure 1A:
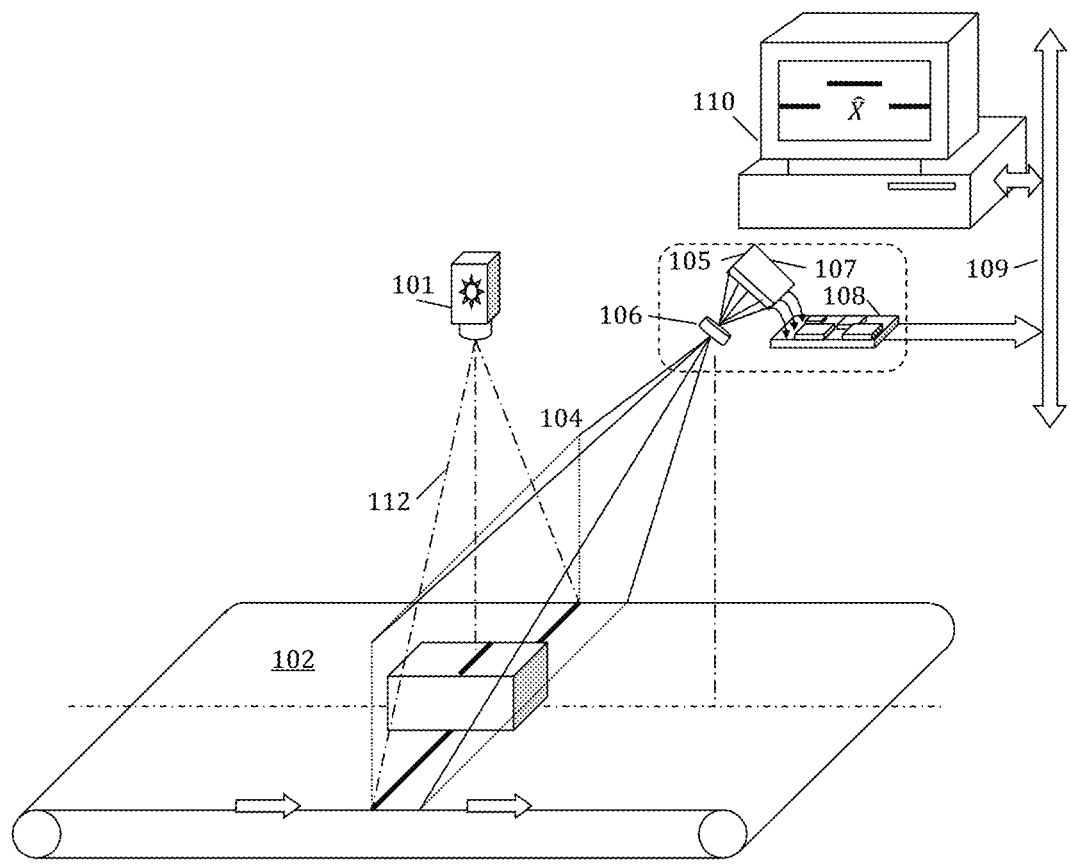
FIG. 1a is a semi-block diagram, semi-illustration of aspects of a machine vision system in an operational environment.

FIG. 1a is a diagram of a vision system for implementing a known method for capturing 3D range images. FIG. 1a comprises, laser-line generator 101, object conveyor 102, object of interest 103, laser illuminated object plane 104, digital camera 105, digital communication channel 109, and digital computer 111 for storing, processing, interpreting and displaying 3D range data extracted from object of interest, which are graphically represented in FIG. 1a by result 110. Digital camera 105 further comprises, imaging lens 106, image sensor 107, and local image processor 108.

In operation a narrow plane of illumination 112, formed by laser-line generator 101 intersects a 3D scene including conveyor 102 and object-of-interest 103. The narrow plane of illumination formed by laser-line generator 101 is coincident with object plane 104 of imaging lens 106. Imaging lens 106 collects light scattered by the 3D scene and focuses it on image sensor 107. Image sensor 107, which comprises a rectangular array of photosensitive pixels, captures an electrical signal representative of the average light intensity signal formed by lens 106 over an exposure time period. The electrical signal formed on image sensor 107 is converted into a digital information stream, which is received by local digital processor 108. Digital processor 108 formats the digital image information for transmission to digital computer 111. In some implementations local digital processor 108 also processes the image to form a alternative representation of the image or extract relevant features to arrive at a critical measurement or some other form of compact classification based on the information of the digital image.

Generally, the image captured by digital camera 105 is processed, either by local digital processor 108 or digital computer 111, to measure the displacement of the line formed by the intersection of the illumination-plane with object in the scene. Each displacement measurement represents an image coordinate that may be transformed into an object surface coordinate in object plane 104, according to a predetermined camera calibration. In some applications object 103 is moved through the plane of the laser-line generator 101 while successively capturing images and extracting displacements coordinates at regular intervals. In this way a map of the surface of object 103 that is visible to the vision system of FIG. 1a can, over time, be constructed by digital computer 111.

Figure 1B:
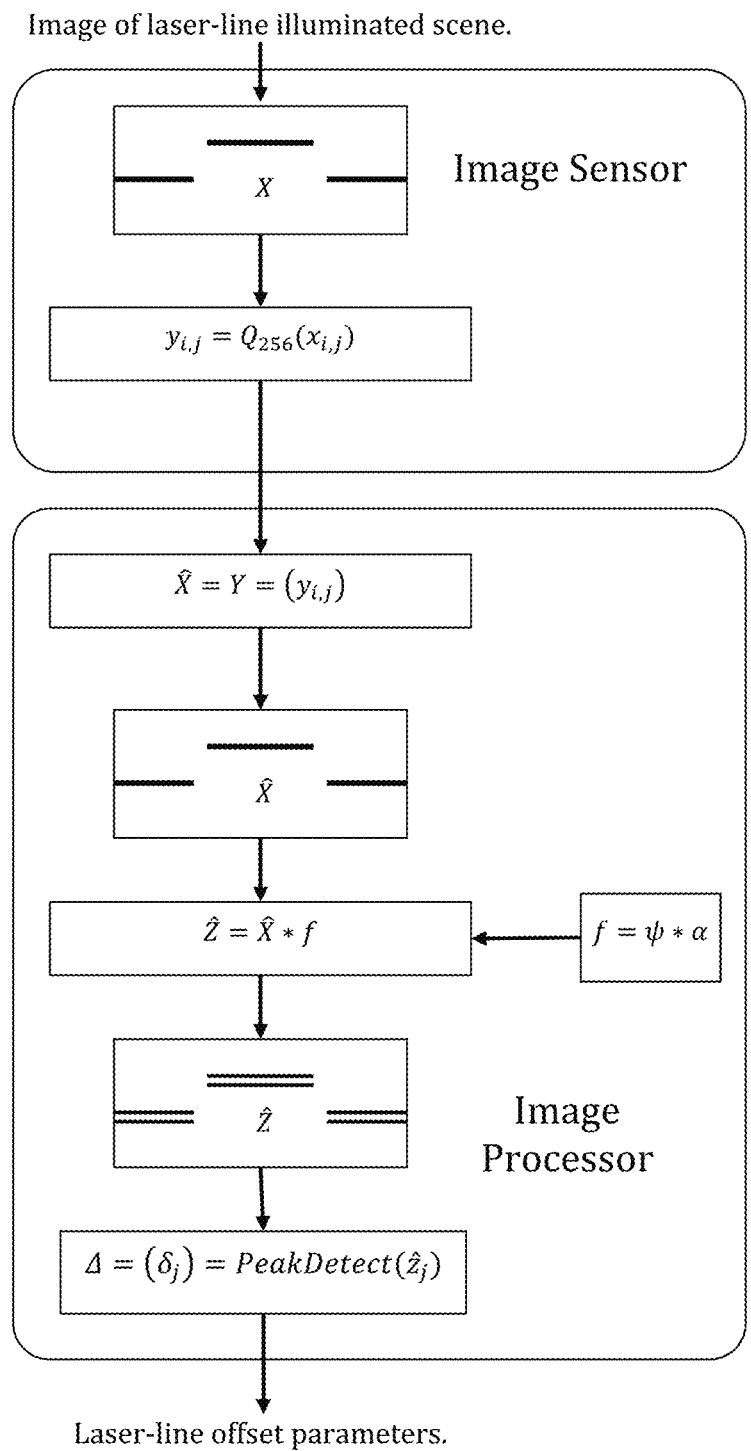
FIG. 1b is a diagram of the computations of a vision system of the prior art.

In order to facilitate a better understanding of aspects of the present invention, as it relates to conventional vision systems of the known art, an example generally based on the prior art is discussed with respect to FIG. 1b. However the discussion is cast in terms consistent with subsequent disclosure with respect to the present invention.

In the following descriptions uppercase symbols, generally, represent matrix quantities, row numbers of a matrix are identified by the subscript i, column numbers by the subscript j, and frame time by the subscript t. Lowercase symbols represent scalar or vector values, for example, $x_{i,j}$ refers to one element of X and $x_j$ refers to a column vector of X. Parentheses are used to collectively reference all of the vectors or elements of a matrix, for example $X=(x_j)=(x_{i,j})$.

In the computations outlined by FIG. 1b:

The symbol X, $X \in \mathbb{R}^{N_1 \times N_2}$, represents an image intensity signal, as it exists on the $N_1$ pixel rows and $N_2$ pixel columns of the pixel array.

The symbol Y, $Y \in \{0, 1, 2 \ldots 255\}^{N_1 \times N_2}$, represents the product of the image signal X and the canonical sampling function quantized by $Q_{256}(\cdot)$ to 256 levels.

The symbol $\hat{X}$, $\hat{X} \in \{0, 1, 2 \ldots 255\}^{N_1 \times N_2}$, represents the image intensity signals recovered from a measurement Y.

The symbol f represents a convolution kernel, which may be a band-pass filter, created by the linear combination of smoothing coefficients α and edge detection coefficients ψ.

The symbol $\hat{Z}, \hat{Z} \in \{-256 \ldots 255\}^{N_1 \times N_2}$, represents the recovered image signal $\hat{X}$ convolved by f, which may result in $\hat{Z}$ being, for example, the approximate partial derivative of the recovered image signal $\hat{X}$ with respect to rows.

The symbol $\Delta, \Delta \in \{0, 1, 2 \ldots N_1\}^{P \times N_2}$ represents image offset parameters of the local signal extremes, i.e. the P relevant signal peaks of the signal $\hat{Z}$ on each column.

In FIG. 1b, the process receives information representative of light energy of a scene. The information may be considered image intensity signals, for example X, where $X \in \mathbb{R}^{N_1 \times N_2}$ and represents the image intensity signals as it exists on the $N_1$ pixel rows and $N_2$ pixel columns of the pixel array. The information may be received by an image sensor, for example image sensor 107 of FIG. 1a.

The image signal X of FIG. 1b includes three segments of a laser line, with a third segment being horizontally between and vertically offset from a first segment and a second segment, representative of, for example, the image of the intersection of illumination plane 112 with conveyor 102 and object 103 of FIG. 1a. The image signal X may also include unwanted off-plane illumination artifacts and noise (not shown). The illumination artifacts may be light internally diffused from one portion of an object to another, for example, light of the laser line, and the noise may be introduced by ambient light or by the image sensor.

In general, the function of the computations outlined in FIG. 1b is to extract row offset parameters associated with the image features of the curve formed of the intersection of a plane of illumination with objects of interest in a physical scene. The conventional method includes steps of sampling the image signal, forming a digital image, filtering the digital image, and extracting image features from the filtered digital image.

A major limitation associated with the conventional machine vision process outlined in FIG. 1b is that a 2-dimensional intensity image of substantial size must be captured by the digital camera for each and every line of physical coordinates formed by the system. This can make the time to capture the 3D image of a scene as much as 100 times longer than the time required to acquire an intensity image of the same size scene, thereby rendering laser-line based 3D image formation methods too slow for many industrial machine-vision applications.

The time it takes to generate a conventional digital representation of an image signal captured by an image sensor, is a function of the size of the image, the speed of the digitizer and the number of digitizers. Conventional image sensors operate by sampling voltage signals generated by each pixel of the array; quantizing the voltage into hundreds, or even thousands, of levels to form a digital intensity image. The process of digital readout includes switching the voltage signal of a pixel on to a conductor connected to the sampling device, waiting for the signal to develop and stabilize, sampling the voltage signal, comparing the sampled voltage signal in multiple discrete steps to a reference signal(s) to arrive at a digital value. Known methods of improving the image capture rate involve restricting the number of rows (or columns) to the minimum number required to accommodate the expected laser-line displacement by objects in the scene, but in practice useful displacement images still require hundreds of rows of pixel readout. Other methods of improving the image capture rate involve the use of multiple analog-to-digital converters. In practice however, the number of analog-to-digital converters is restricted by the conductors necessary to access the individual pixel voltages. In a conventional CMOS image sensor conductors are non-transparent, typically positioned in the optical path near photosensitive areas, and can only be stacked in a finite number of layers. The forgoing typically limits the useful number of digitizers to be less than or equal to the number of columns or rows of the pixel array. Much is known about high-speed methods for digitizing images, but, ultimately, there are certain practical limits to the speed that can be achieved using conventional methods of digital image acquisition.

In the present machine vision application, we observed that a scene illuminated by a plane of light will be viewed by a camera as a relatively sparse image, i.e. an image in which the vast majority of image sensor pixels can be represented by the numeric value zero, having receive very little (or no) light from the scene. We further observe that, the intersection of the visible illumination plane with practical objects-of-interest moving through the camera field of view are, generally, piecewise smooth and continuous functions, and the image information content that we seek could be adequately represented by just a few bits per column of the image. Given the intended application, it is readily apparent that the useful information content of the image signal stream is exceedingly small relative to the dimension of the signal, implying that conventional image digitization methods spend most of their time sampling and converting redundant signal information. Significant improvement in the throughput of the vision system might be possible if such redundant readout and conversion of the analog image signal could be avoided.

In the field of compressive sensing it has been shown that, under certain conditions, a signal vector $x \in \mathbb{R}^N$ consisting of zeros and K non-zero coefficients can be recovered from only $$M = O\left(K \log\left(\frac{N}{K}\right)\right)$$

measurements. In this formulation:

$y=Ax, y \in \mathbb{R}^M$, where $A \in \mathbb{R}^{M \times N}, M << N.$

The conditions alluded to above are that any relevant variation of signal vector x must result in the formation of a unique measurement vector y, such that:

$Ax_1 - Ax_2 \neq 0$ for all $x_1 \neq x_2$

Given the above, x can be recovered from y and A by searching for the maximally sparse vector $\hat{x}$ that generates a matching measurement vector y.

$\hat{x} = \operatorname{argmin} \|x\|_0$ subject to $y=Ax$

The computational complexity of such a search grows exponentially with the dimensionality of the search space, which is directly proportional to K, the sparseness of the signal vector x. This fact makes the solution generally intractable for larger values of K, that is, unless 1) x is sufficiently sparse and 2) the measurement matrix A conforms to the, so called, restricted isometry property, which requires the existence of a constant δ such that for signal vectors x of sparseness K.

$(1-\delta)\|x\|_2^2 \leq \|Ax\|_2^2 \leq (1+\delta)\|x\|_2^2$

The preceding implies that for small constants δ the measurement and the signal have sufficiently similar $l_2$ norms, in which case convex optimization methods apply whereby $\hat{x}$ can be found at its $l_1$ minimum, subject to the constraint that it is consistent with the measurement $\hat{x} = \operatorname{argmin} \|x\|_1$ subject to $y=Ax$ Assuming additive noise vector n, where $\|n\|_2 \leq \epsilon$ $\hat{x} = \operatorname{argmin} \|x\|_1$ subject to $\|y-Ax\| \leq \epsilon$ Regardless of the recovery method, the essential element of the compressive sensing model is a prior knowledge of signal sparseness, without which it is difficult or impossible to guarantee a unique mapping from the signal vector x to the measurement vector y or to provide for efficient recovery, even if a unique mapping does exist.

In light of the sparseness of the anticipated image signal, the forgoing model of compressive sensing seems promising. However, there are, ostensibly, significant difficulties relative to known methods of image sensor design and fabrication. One difficulty is that both the measurement vector y and the sampling function A are assumed to consist of coefficients belonging to the set of real numbers. To achieve a speed improvement over conventional methods would require a huge number of high dynamic-range analog computations performed in parallel, plus the precision digitization of the resultant analog signal.

Some of the difficulties associated with the practical implementation mentioned above are addressed by the theories of 1-bit compressive sensing, which is, essentially, conventional compressive sensing theory with extreme quantization of the measurement signal y. In 1-bit compressive sensing each measurement is quantized to 1-bit by the function sign(·), and only the signs of the measurements are stored in the measurement vector y.

$y = \operatorname{sign}(Ax)$, where $y \in \{1, -1\}^M$

The preceding represents a simplification of the analog-to-digital conversion process, which provides some hope for realistic implementation. Note, however, that the nature of the measurement process is to destroy the scale information from the original signal. Therefore, in this formulation only partial reconstruction, within a scale factor, is possible. This fact has significance relative to the design of the image sensor of the present invention that will be explained later.

To estimate the actual potential of 1-bit compressive sensing relative to acceleration of the digital capture of information contained within the image of a scene illuminated by a plane of light, it is necessary to appreciate the nature of the relationship that exists between the signal vector x, the sampling matrix A, and the measurement vector y.

Let $x_1$ and $x_2$ represent any of two signal vectors $x_1 \neq x_2$ normalized to the unit sphere, and let measurement $y_1 = \text{sign}(Ax_1)$ and measurement $y_2 = \text{sign}(Ax_2)$, then, $\text{sign}(Ax)$, which maps $\mathbb{R}^N \to \mathcal{B}^M$, is a, so called, binary $\epsilon$-stable embedding of order K for a K-sparse signal x if $$d_{ang}(x_1, x_2) - \epsilon \leq d_{ham}(y_1, y_2) \leq d_{ang}(x_1, x_2) + \epsilon$$

In words, the normalized vector angle between any two signals is equal to the normalized Hamming distance between their measurements, within some tolerance $\epsilon$.

In 1-bit compressive sensing it has been shown that if A consists of I.I.D (Independent and Identically Distributed) random variables, e.g. a Bernoulli distribution, and $\epsilon > 0$, then $y = \text{sign}(Ax)$ is a binary $\epsilon$-stable embedding with probability $P_r > 1 - \rho$ for $$M \geq \frac{2}{\epsilon^2}\left(K\log(N) + 2K\log\left(\frac{50}{\epsilon}\right) + \log\left(\frac{2}{\rho}\right)\right)$$

The preceding equation predicts the lower bound on the number of samples required to ensure the recognition of a signal of a certain size and sparseness to a designated resolution.

To arrive at an estimate of the minimum number of samples M required to encode a column of an image formed of a scene illuminated by a plane of light, we begin by assuming that the signal x can be modeled as a sparse image vector comprising a narrow laser-line pulse shifted to some row offset $\theta$. Such an ideal laser line pulse signal would be K=1 sparse on each column vector of the image.

Assuming that one wishes to estimate $\theta$ within some shift tolerance $\delta = 1$, implies that $\epsilon < 0.50$ is necessary to guarantee a minimum level of accuracy.

Therefore, to ensure $$d_{ang}(x_\theta, x_{\theta+\delta}) - \epsilon \leq d_{ham}(y_\theta, y_{\theta+\delta}) \leq d_{ang}(x_\theta, x_{\theta+\delta}) + \epsilon$$

to probability greater than 0.90, given K=1, N=512, $\epsilon < 0.50$ theoretically requires only:

$$M \geq \frac{2}{0.50^2}\left(1\log(512) + 2\log\left(\frac{50}{0.50}\right) + \log\left(\frac{2}{0.10}\right)\right) =$$

148 Bits/Image Column

The preceding calculation implies the potential for substantial data reduction relative to the 8-bit/pixel digital image, typically formed by conventional CMOS image sensors. To the extent that the throughput, i.e. frame rate, of the image sensor, is governed by the amount of information processed, it is not unreasonable to anticipate speed improvements of the same order of magnitude.

Unfortunately, some of the assumptions associated with the ideal example case described above depart significantly from practical reality. For example, the column vectors of an image formed of a plane-of-light illuminating the surface of an object, although generally containing less nonzero elements than a normally illuminated image, still contain many more nonzero values than necessary to encode the position of the laser line to the nearest pixel. This is due to the fact that, even in the best case, the image of the laser line has a finite and variable thickness in terms of the number of rows it occupies on any given column of the image. Additionally, it is common for some of the light scattered or diffused by the object to illuminate other points of the surface of the object that are not in the plane of the laser, but nonetheless are in the field-of-view of the camera, and thereby contribute to the sum of nonzero values in the image. Since the typical laser-line image is already relatively sparse, a linear transformation into a different basis typically does not provide a meaningful reduction in nonzero signal coefficients. Noise and certain unavoidable nuisance parameters associated with the laser-line image contribute directly to the number of nonzero values in the image signal and indirectly to the number of samples M that are necessary to capture a measurement that accurately encodes the laser line coordinates in the measurement. Moreover, depending on the implementation of the digital processor, the task of restoring the digital signal from the measurement can quickly grow to dominate the effective cycle time, rendering compressive sensing methods useless for the purpose of improving vision system throughput.

An aspect of the present invention is that, unlike the system of FIG. 1b, the original image signal X is not encoded in the measurement Y, because doing so would, necessarily, require the encoding of additional image information that is not directly relevant to extracting the offset parameters of the intersection of the illumination plane with objects of interest in the physical scene. Rather, a filtered image signal Z is encoded in the measurement Y. One reason for this is that, as explained above, the number of samples required to embed all variation of the signal to a specific error tolerance $\epsilon$ is of order $O(K \log(N))$. By filtering the image signal X to attenuate spatial frequencies that do not contain information essential to the extraction of the laser-line offset parameters, the sparseness of Z increases, such that $K_Z < K_X$ and the number of samples required to robustly encode the filtered signal in the measurement Y will, in practice, always be less (often much less) than, the number of samples required to encode the raw image signal X, assuming that the error tolerance E remains the same.

Figure 2A:
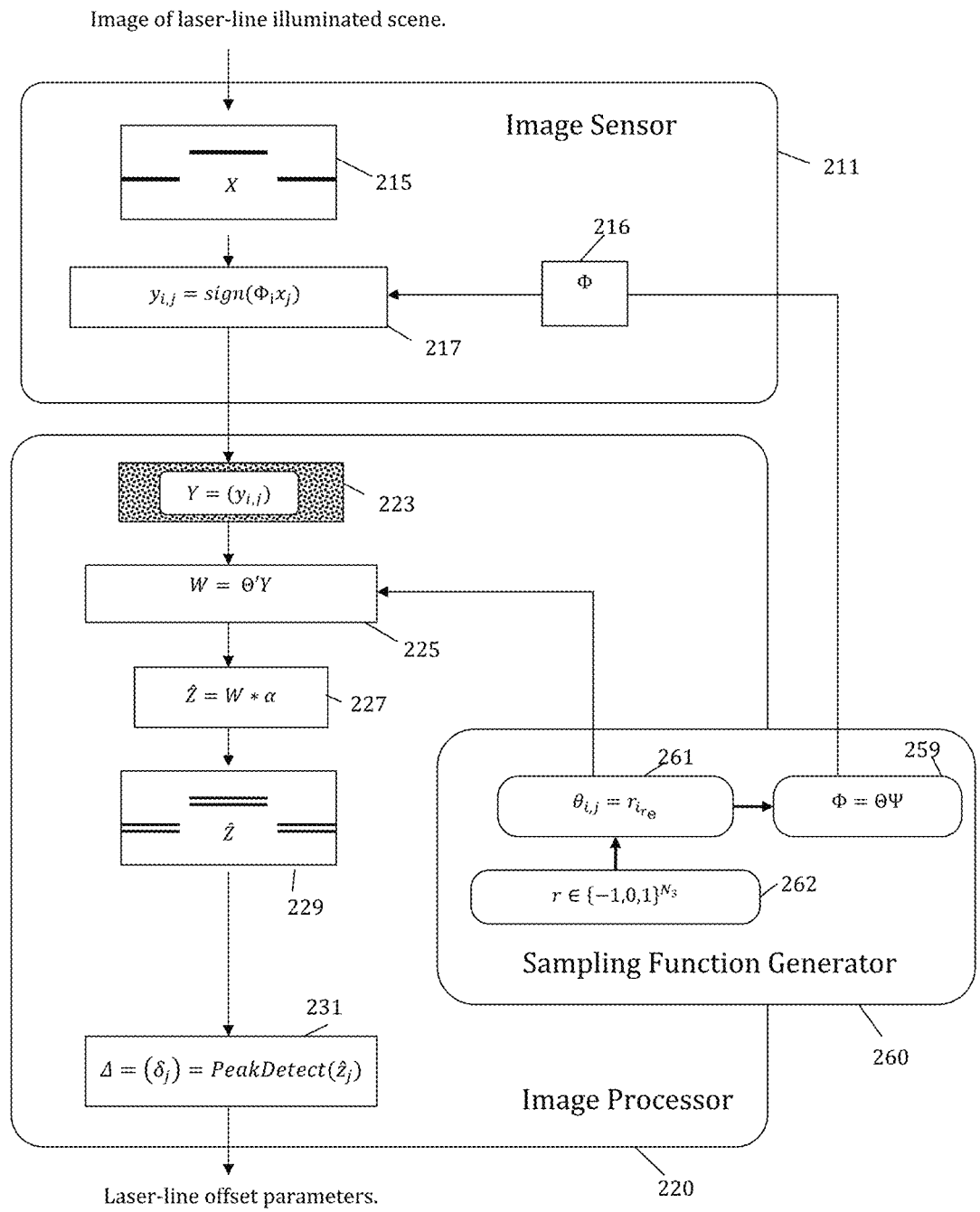
FIG. 2a is a flow diagram of a process depicting computations performed by a machine vision system in accordance with certain aspects of the present invention.

FIG. 2a depicts a semi-flow diagram of a process, particularly computations of the process, performed by a machine vision system in accordance with aspects of the invention. The machine vision system may be, for example, a system including some or all of the hardware of the system of FIG. 1a.

In the computations outlined in FIG. 2a:

The symbol X, $X \in \mathbb{R}^{N_1 \times N_2}$ represents an image intensity signal as it exists on $N_1 \times N_2$ pixel elements of an image sensor, with for example pixel elements of the image sensor forming a pixel array which may have $N_1$ pixel rows and $N_2$ pixel columns.

The symbol $\Psi$, $\Psi \in \{-1, 0, 1\}^{N_1 \times N_1}$, represents an image filtering function comprised of, and in some embodiments consisting of coefficients used to compute a central difference approximation of the partial first derivative with respect to rows of the image signal X.

The symbol $r \in \{-1, 0, 1\}^{N_3}$, represents a sparse random sequence, which in some embodiments is based on a Markov chain of order m, where $m > 1$.

The symbol $\Theta$, $\Theta \in \{-1, 0, 1\}^{M \times N_1}$, represents a random basis function, created by drawing row vectors from r.

The symbol $\Phi$, $\Phi \in \{-1, 0, 1\}^{M \times N_1}$, represents an image sampling function, formed from the product of the random basis $\Theta$ and the filtering function $\Psi$.

The symbol Y, $Y \in \{-1, 1\}^{M \times N_2}$, represents a measurement of the filtered image intensity signal, formed from the product of the sampling function $\Phi$ and the image signal X, quantized by $\text{sign}(\cdot)$ to two levels $\{-1, 1\}$.

The symbol W, $W \in \{-M \ldots M\}^{N_1 \times N_2}$, represents an estimate of the filtered image signal, formed from the product of the measurement Y and the transpose of the random basis function Θ.

The symbol $\hat{Z}, \hat{Z} \in \{-M \ldots M\}^{N_1 \times N_2}$, represents an estimate of the product of the original image signal X and the filtering function Ψ.

The symbol $\Delta, \Delta \in \{0, 1, 2 \ldots N_1\}^{P \times N_2}$ represents image offset parameters of the local signal extremes, i.e. the P relevant signal peaks of the signal Z on each column.

In FIG. 2a, block 215 represents information of the image signal X, which is information representative of light energy of a scene. The information may be received by an image sensor, for example image sensor 107 of FIG. 1a. The light energy may be light scattered from the scene, with at least some of the light focused by a lens onto the image sensor. The image may also include unwanted off-plane illumination artifacts and noise (not shown). The illumination artifacts may be light internally diffused from one portion of an object to another, for example light of the laser line, and the noise may be introduced by ambient light or by the image sensor, for example.

Block 217 includes a representation of a process that generates a measurement Y of the image intensity signal X. The measurement Y represents a product of the image signal X and the sampling function Φ, quantized to two levels. In most embodiments the sampling function is a product of a random basis function and a spatial filtering function. In some embodiments the random basis function is sparse, the non-zero elements drawn from a Bernoulli distribution or some other generally random distribution. In some embodiments the sampling function is expected to generally pass spatial frequencies associated with portions of an image forming a laser line and to substantially reject spatial frequencies associated with portions of an image including noise and other unwanted image information. In some embodiments the process of block 217 extracts information of the image signal X by iteratively generating elements of a measurement Y. Generation of the information of the measurement Y may be performed, in some embodiments, by an image sensor device and/or an image sensor device in conjunction with associated circuitry.

In some embodiments elements of Y are generated in M iterations, with for example each of the M iterations generating elements of a different $y_i$. In some embodiments, for example embodiments with an image sensor having pixel elements arranged in $N_1$ rows and $N_2$ columns and a sampling function having M rows and $N_1$ columns, in each iteration information of a different particular row of the sampling function is effectively applied to columns of the image sensor to obtain, after performing sign operations on a per column basis, a $y_i$. In some embodiments elements of a $y_i$ are obtained substantially simultaneously. In some embodiments comparators are used to perform the sign operations.

In some embodiments, for each iteration information of each row $\phi_i$ of the sampling function is used to generate control signals applied to pixel elements of the image sensor, with each row of pixel elements receiving the same control signal or signals. Accordingly, in some embodiments, for a first iteration control signal(s) based on information of $\phi_{1,1}$ may be applied to pixel elements of a first row of pixel elements, control signal(s) based on information of $\phi_{1,2}$ may be applied to pixel elements of a second row, and so on. Similarly, for a Mth iteration, control signal(s) based on information of $\phi_{M,1}$ may be applied to pixel elements of the first row, control signal(s) based on information of $\phi_{M,2}$ may be applied to pixel elements of the second row, and so on.

In some embodiments, and as shown in FIG. 2a, the image signal sampling information is provided from the sampling function generator block 260. As illustrated in FIG. 2a, the sampling function generator block is associated with an image processor 220, which in various embodiments may be, variously, the local digital processor 108 or digital computer 112 of FIG. 1a. It should be recognized, however, that in various embodiments the sampling function generator, or portions thereof, may be included in the image sensor 211. In some embodiments, the image sensor, or memory or circuitry associated with the image sensor, provides storage for storing the image signal sampling information, for example as illustrated by block 216 of FIG. 2a. In some embodiments neither the image sensor or the image processor include a sampling function generator block, with instead pre-generated image signal sampling information stored in storage of or associated with the image sensor. In some embodiments the image signal sampling information may be stored in both of two storage elements, with a first storage element physically closer to some pixel elements and a second storage element physically closer to other pixel elements. For example, if columns of pixel elements forming the pixel array are considered to be arranged in a manner defining a square or rectangle, the first storage element may be about what may be considered one side of the pixel array, and the second storage element may be about an opposing side of the pixel array. In some such embodiments pixel elements closer to the first storage element may receive control signals associated with the first storage element, and pixel elements closer to the second storage element may receive control signals associated with the second storage element.

Figure 6:
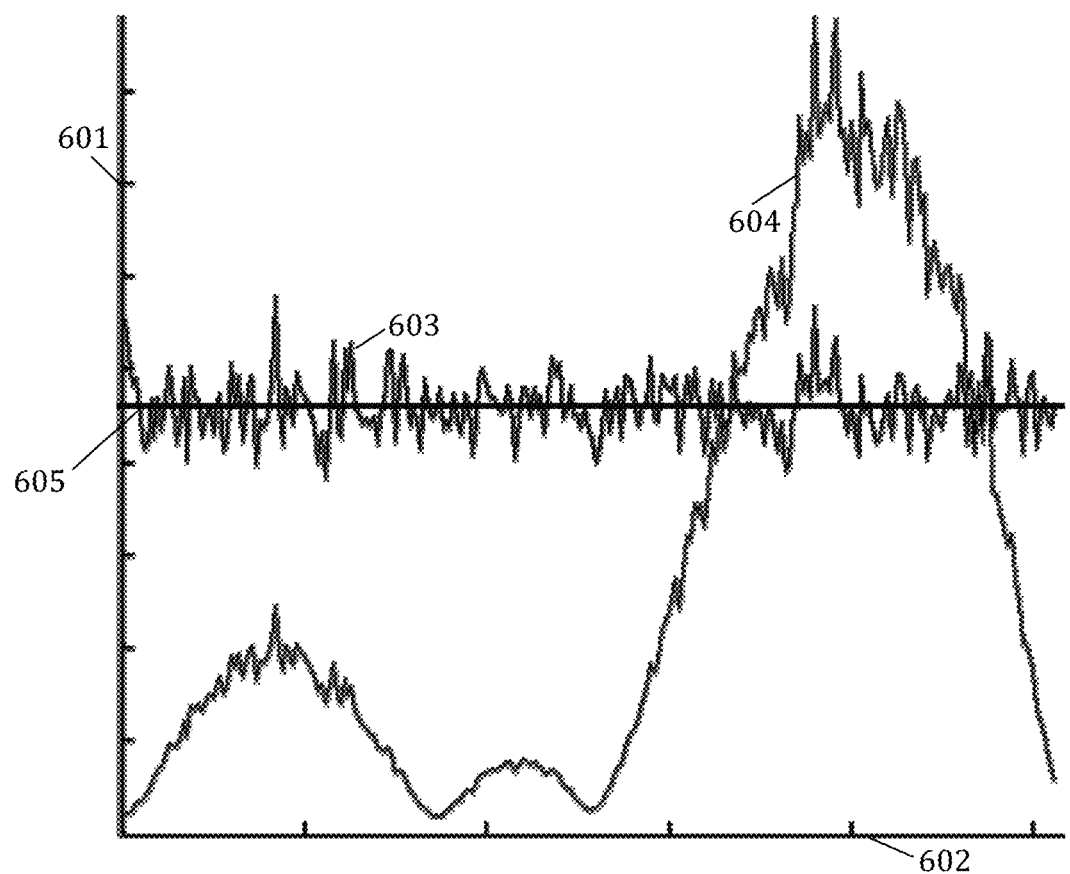
FIG. 6 is a graph illustrating sensor response curves.

FIG. 6 is an exemplary graph illustrating spatial frequency response, taken here with respect to image rows, representative of some embodiments in accordance with aspects of the invention. FIG. 6 includes frequency response axis 601, frequency axis 602, flat frequency response line 605, and frequency response curve 603 of a conventional compressive sampling function, and frequency response curve 604 which is exemplary of some embodiments of the present invention.

Generally, a signal sensing apparatus, for example an image sensor, provides a set of basis vectors capable of sampling a signal to encode, as completely as possible, the information from a signal in a measurement. A canonical sampling function, conforming to a minimum regular sampling rate criterion, (e.g. Nyquist's criterion), represents, in effect, a perfectly flat frequency response curve, as illustrated in frequency response curve 605, and, in theory, any conforming signal can be perfectly reconstructed from its measurement vector.

Compressive sensing methods allows traditional sampling rate criteria to be relaxed based on a priori knowledge regarding the information content of the signal, as represented in terms of sparseness or compressibility, which is the minimum number of coefficients necessary to accurately represent the signal in some, possibly unknown, orthogonal linear basis. In order to provide this generality the compressive sampling function must have an approximately flat frequency response, such as exhibited in frequency response curve 603, which was derived from a conventional compressive sampling function based on random projections. This requirement is self evident in light of the fact that, in general, knowledge about the amount of information included in a signal conveys no information whatsoever about the frequency distribution. Therefore, the frequency response of the conventional compressive sampling function must be approximately flat to guarantee general sparse signal recoverability.

In contrast to the frequency response curve of the canonical sampling function 605 and conventional compressive sampling function 603, the frequency response depicted in curve 604, which is exemplary of some embodiments of the present invention, is decidedly not flat. This is because, in this example, the sampling function was formed, not only with a priori knowledge of the signal's general information content, but also with a prior knowledge of the spatial frequency distribution, not only of the signal, but of the signal's information content.

Returning to FIG. 2a, and blocks 261,262,259 of the sampling function generator, in some embodiments the vector r, $r \in \{-1,0,1\}^{N_3}$, where $N_3 = N_1 + 2Md$ and $d =$ support ($\psi$), the size of the spatial filtering kernel $\psi$. In some embodiments, information of the vector r can be understood as having been formed from the element-wise product of two vectors b, $b \in \{-1,1\}^{N_3}$ and c, $c \in \{0,1\}^{N_3}$, as in the following:

$$r = (r_i) = (b_i c_i)$$

where b is based on a random distribution:

$$P(b_i = 1) = P(b_i = -1) = \frac{1}{2}$$

and c is based on a Markov chain of order m=2d:

$$P(c_i = 1 \mid c_{i-r} = 1) = \frac{\sum_{r=1}^{m} F(r)(r-d)}{d},$$

where $$\begin{cases} F(r) = 0, \, r \leq d \\ F(r) = 1, \, r > d \end{cases}$$

The random basis functions $\Theta$ are derived by sampling the vector r according to the following equation:

$$\theta_{i,j} = r_{i_{r\Theta}} \text{ where } i_{r\Theta} = m(i-1) + (j-1)$$

In words, the rows of the random basis functions $\Theta$ are $N_1$ element segments of r that are shifted by no less than m relative to each other.

The sampling functions $\Phi$ can be thought of as being formed from the convolution of the rows of $\Theta$ with a filtering kernel $\psi$ as follows:

$$\phi_i = \theta_i * \psi$$

which in FIG. 2a is stated as:

$$\Phi = \Theta \Psi, \text{ where } \Psi = I * \psi$$

In some embodiments the convolution kernel $\psi$ performs spatial filtering based on a central difference approximation of the first derivative, for example, $\psi = (+1, +1, +1, 0, -1, -1, -1)$, in which case:

$$m \geq 2d = 14$$

In general, m should be of sufficient size to ensure that the range of the sampling function $\Phi$, which is limited by the image sensor hardware to discrete levels, is guaranteed. In the preferred embodiment, the elements of $\Phi$ are all in range, i.e. $\phi_{i,j} \in \{-1,0,1\}$ and that the rows of the sampling function $\Phi$ are sufficiently uncorrelated.

In block 223 the process buffers a measurement Y of the image signal. The measurement is comprised of the column vectors $y_j$ of the measurement of the image intensity signals. In most embodiments the measurement of the image signal is formed by circuitry of or associated with the image sensor, and the measurement may be stored in memory of or associated with the image processor. The image sensor and the image processor for the embodiment of FIG. 2b and the other embodiments, may be coupled by a serial data link, in some embodiments, or a parallel data link, in other embodiments. In addition, operations of blocks 225-231, discussed below, may also be performed by circuitry of or associated with the image processor.

In block 225 the process forms W a first estimate of the filtered image Z. In the embodiment of FIG. 2a, the estimate is determined by the product of the transpose of the random basis function $\Theta$ and the measurement Y. In block 227 the process refines the estimate of the filtered image Z. In some embodiment, and as shown in FIG. 2a, the estimate of the filtered image formed by the process of block 255 is refined by convolution with a kernel $\alpha$.

In some applications involving laser-line illumination, the laser-line may sometimes be modeled by a square pulse of finite width where the width of the laser-line pulse is greater than (or equal to) the support of the filtering kernel $\psi$. In accordance with the model described above the image averaging kernel is sometimes matched to the expected output of the filtering kernel $\psi$. For example, if the filtering kernel is given by $\psi = (+1, +1, +1, 0, -1, -1, -1)$ then the convolution kernel of block 227 may be $\alpha = (1, 2, 3, 3, 2, 1)$.

It may be noted that the refinement step of block 227 could be performed in block 225 by folding the kernel $\alpha$ into the transpose of the random basis function $\Theta$ before computing its product with the measurement Y. However, performing the operation by convolution in block 227 provides for a significant computational advantage in some embodiments where the matrix multiplication of block 225 is performed by methods of sparse matrix multiplication.

Block 229 buffers a final estimate of the filtered image $\hat{Z}$. Locations of edges of laser lines in the estimate are determined by the process in block 231, for example using a peak detection algorithm.

Figure 2B:
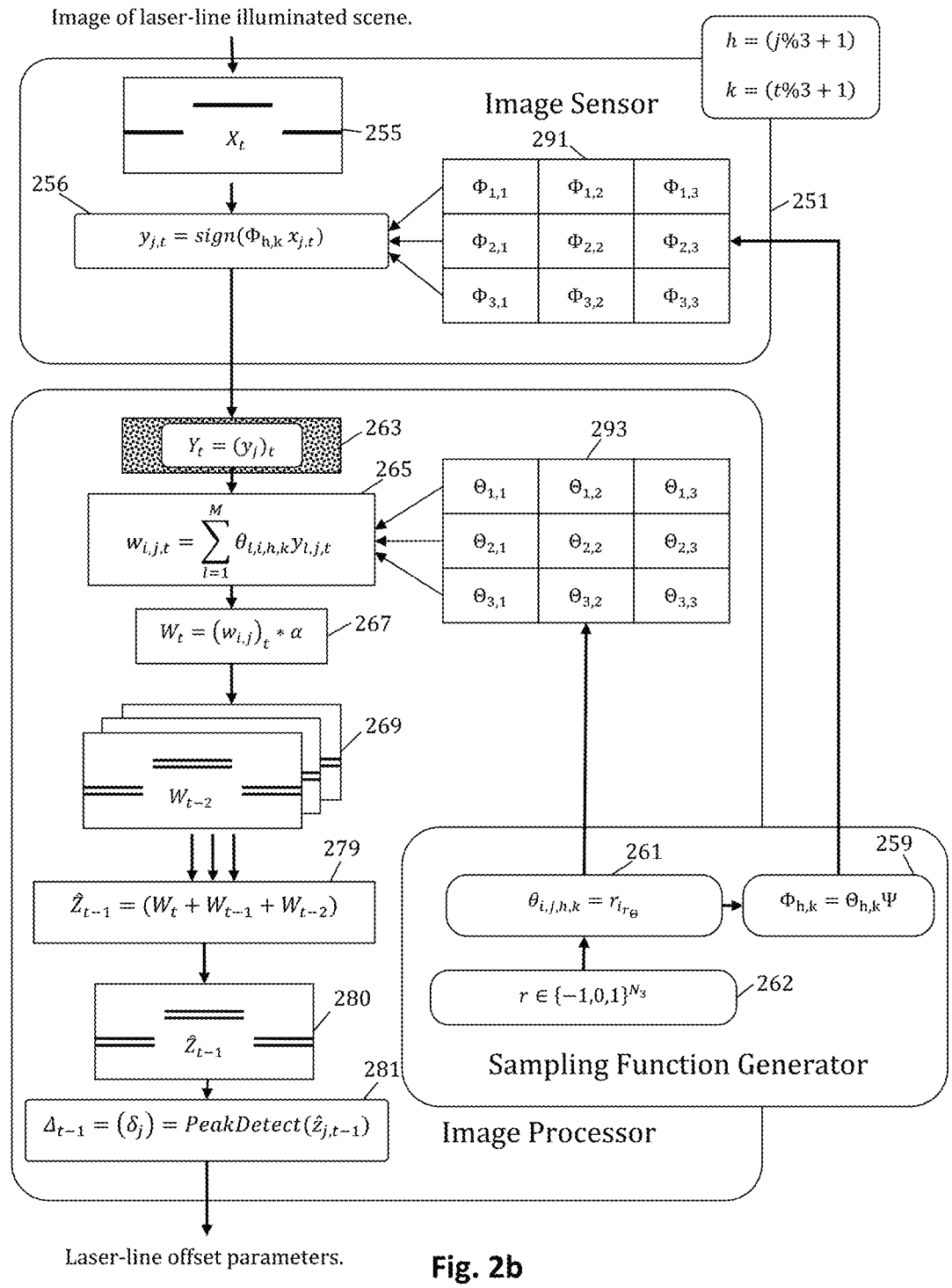
FIG. 2b is a flow diagram of a further process depicting computations performed by machine vision system in accordance with certain aspects of the present invention.

FIG. 2b depicts a semi-flow diagram of a process, particularly computations of the process, performed by a machine vision system in accordance with certain aspects of the present invention. The machine vision system may be, for example, a system including some or all of the hardware of the system of FIG. 1a.

The process of FIG. 2b, takes advantage of the a priori knowledge that the temporal image stream formed of an illumination plane passing over a 3-dimensional object of interest is more generally sparse than anticipated by methods of FIG. 2a; the image signal being sparse and/or compressible, not only with respect to the row dimension of the signal X, but also with respect to columns and with respect to time. In other words, adjacent columns j of X are likely to be very similar, i.e. highly correlated with each other. Likewise, the image signal X is typically very similar from one frame time to another. A frame time may be, for example, a time period in which M samples are obtained for each of the columns of the image signal.

FIG. 2b shows computations of a vision system, similar to that of FIG. 2a, except that the random basis function $\Theta$ and sampling function $\Phi$ are partitioned into multiple independent segments, and these segments are used in a spatiotemporally interleaved fashion. Preferably, and in some embodiments, the spatiotemporally interleaving guarantees that, in any given frame time t, no column j of the image is sampled with the same pattern as either of its spatial neighbors j−1 or j+1 and that the sampling pattern used in the current frame-time is different from the sampling pattern of the previous frame time and the sampling pattern of the next frame time.

As compared to FIG. 2a, the computations outlined in FIG. 2b show, what may be thought of as, 9 smaller sampling functions used over 3 frame times, 3 sampling functions being applied concurrently to X at any given time t. In practice this method allows the number of samples M per frame-time t to be reduced relative to the methods outlined in FIG. 2a, while maintaining the same error tolerance associated with the binary ϵ-stable embedding of the signal Z, and thereby providing for significantly more computational efficiency relative to the vision system of FIG. 2a.

Although FIG. 2b shows the use of both spatial and temporal interleaving of the sampling function, in alternative embodiments, however, use of sampling functions may be interleaved in space only, or in time only.

In the process outlined in FIG. 2b:

The symbol $X_t$, $X \in \mathbb{R}^{N_1 \times N_2}$ represents an image intensity signal as it exists on the $N_1$ pixel rows and $N_2$ pixel columns of the pixel array at time t.

The symbol $\Psi$, $\Psi \in \{-1,0,1\}^{N_1 \times N_1}$, represents an image filtering function comprised of, and in some embodiments consisting of coefficients used to compute a central difference approximation of the partial first derivative.

The symbol $r \in \{-1,0,1\}^{N_3}$, represents a sparse random sequence, which in some embodiments is based on a Markov chain of order m, where m>1.

The symbol $\Theta_{h,k}$, $\Theta \in \{-1,0,1\}^{M \times N_1}$, h=(j %3+1), and k=(t %3+1) represents an array of random basis functions $\Theta$, created by drawing row vectors from r.

The symbol $\Phi_{h,k}$, $\Phi \in \{-1,0,1\}^{M \times N_1}$ represents an array of image sampling function, formed from the product of the random basis $\Theta_{h,k}$ and the filtering function $\Psi$.

The symbol $Y_t$, $Y \in \{-1,1\}^{M \times N_2}$ represents a measurement of the filtered image intensity signal at time t, formed from the product of the sampling function $\Phi_{1,k}$, $\Phi_{2,k}$ and $\Phi_{3,k}$, and the image signal $X_t$, quantized by sign(·) to two levels {−1,1}.

The symbol $W_t$, $W \in \{-M \ldots M\}^{N_1 \times N_2}$, represents a estimate of the filtered image signal, formed from the product of the measurement $Y_t$ and the transpose of the random basis functions $\Theta_{1,k}$, $\Theta_{2,k}$ and $\Theta_{3,k}$ convolved by $\alpha$.

The symbol $\hat{Z}_{t-1}$, $\hat{Z} \in \{-M \ldots M\}^{N_1 \times N_2}$, represents an estimate of the product of the original image signal X and the filtering function $\psi$, formed from the sum of $W_t$, $W_{t-1}$ and $W_{t-2}$.

The symbol $\Delta_{t-1}$, $\Delta \in \{0, 1, 2 \ldots N_1\}^{P \times N_2}$ represents image offset parameters of the local signal extremes, i.e. the P relevant signal peaks of the signal Z on each column at time t−1.

Accordingly, as with the process of FIG. 2a, in block 255 the process of FIG. 2b receives information representative of light energy of a scene, and in block 256 the process iteratively generates vectors of a measurement of image intensity signals, based on the relative light energy of the image of the scene. As in the process of FIG. 2a, the functions provided by blocks 255 and 256 may be performed using an image sensor 251.

In the process of FIG. 2b, however, generation of the measurement is performed using a plurality of sampling functions. In the embodiment of FIG. 2b nine sampling functions are used, interleaved spatially and temporally. In some embodiments three different sampling functions are used at any frame-time t, with a prior frame time and a succeeding frame time using different sets of three sampling functions. The nine sampling functions, or information to generate the sampling functions, may be dynamically generated and/or stored in memory 291 of, or associated with, the image sensor.

In block 263 the process buffers a measurement $Y_t$ of the image signal X at frame time t. In most embodiments the measurement Y of the image signal is formed by circuitry of or associated with an image sensor and stored in memory of or associated with an image processor. In addition, operations of blocks 265-281, discussed below, may also be performed by circuitry of or associated with the image processor.

In block 265 the process computes partial estimates of the filtered image signal Z. In the embodiment of FIG. 2b, the estimate W is determined by taking the product of the transpose of the corresponding random basis function $\Theta_{h,k}$ and the measurement $Y_t$, with a new estimate W formed for each frame-time t.

In block 267 the process convolves the partial sums emitted by block 265 kernel $\alpha$, which in addition to refining the estimate of the filtered image as described earlier, with respect to FIG. 2a, combines neighboring column vectors, such that each column vector is replaced by the sum of itself and its immediate neighbors on the left and right.

In block 279 the process combines the partial sums output by block 267 over the previous three frame times to form the final estimate of the filtered image signal Z at frame-time t−1, storing the result in block 280. As in FIG. 2a, parameters of the illumination plane are determined by the process in block 281, for example using a peak detection algorithm.

Figure 3:
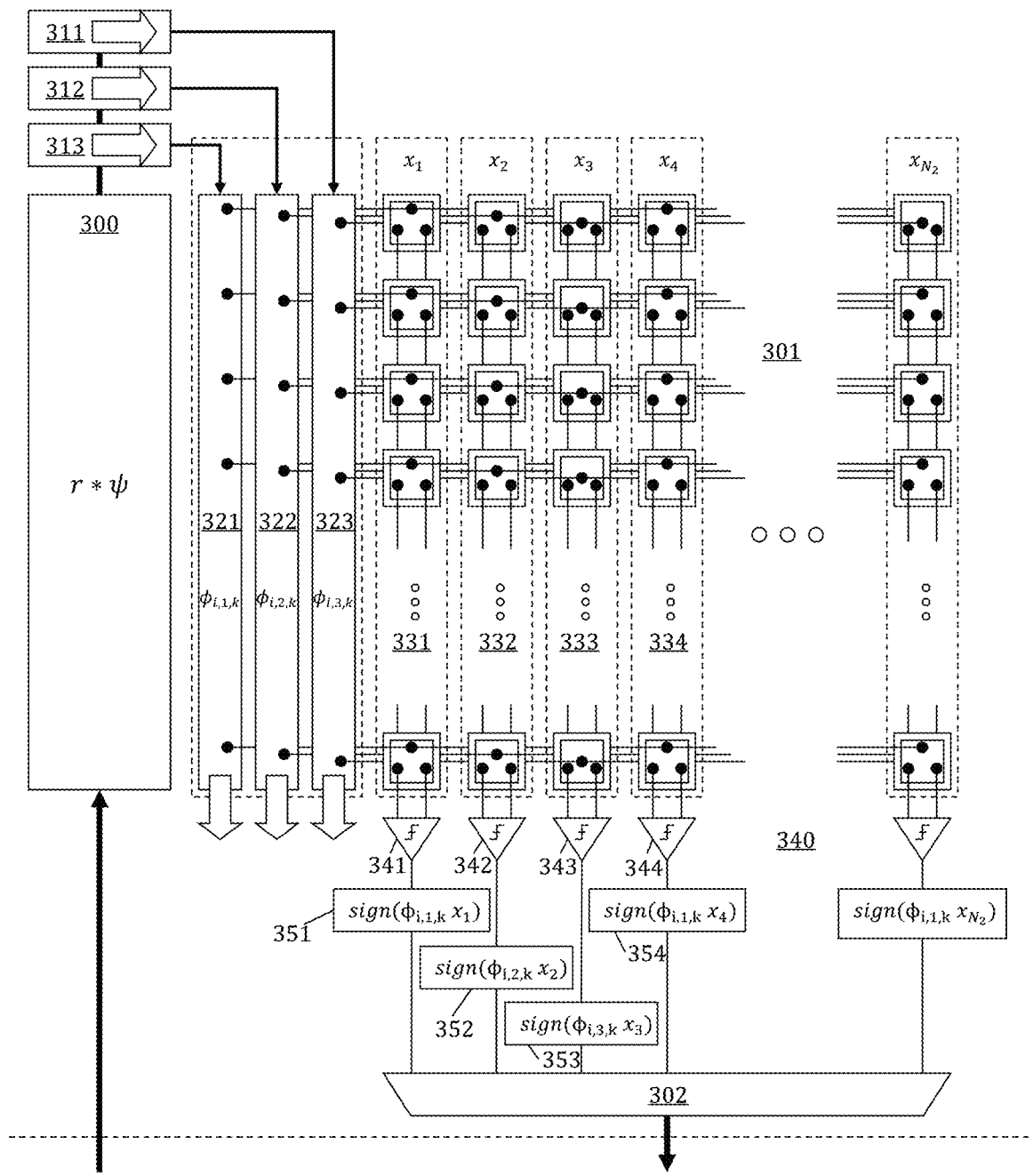
FIG. 3 is a high-level block-diagram of an image sensor architecture representative of certain aspects of the present invention.

FIG. 3 is a high-level block-diagram depicting an image sensor architecture representative of certain aspects of the present invention. The image sensor of FIG. 3 comprises: sampling function storage buffer 300; sampling function shift register input buffers 311,312,313; sampling function shift registers 321,322,323; pixel array 301 with pixel columns 331,332,333,334 included therein; analog signal comparator array 340, including analog signal comparators 341, 342,343, and 344; 1-bit digital output signal lines 351,352, 353,354; and output data multiplexer 302. Each of the pixel columns include a plurality of pixel elements. Generally each pixel element includes a radiation sensitive sensor (light sensitive in most embodiments) and associated circuitry.

Pixel elements of pixel array 301 accumulate photo-generated electrical charge at local charge storage sites. The photo-generated charge on the image sensor pixels may be considered an image intensity signal in some aspects. In some embodiments each pixel element includes a fixed capacitance that converts accumulated charge into a pixel voltage signal. Each pixel voltage signal controls a local current source, so as to provide for a pixel current signal. The pixel current source can be selected and switched, under the control of a sampling function, on to one of two signal output lines available per pixel column. Output lines are shared by all pixels on a column, such that each of the two current output signal formed on a column represent the summation of current supplied by selected pixels.

As may be seen from the use of the three sampling function shift registers, the embodiment of FIG. 3 is suited for use in a system implementing spatial interleaving (and spatio-temporal interleaving) as discussed with respect to FIG. 2b. The architecture of FIG. 3 may also be used for the non-interleaved embodiment of FIG. 2a, with either the three shift registers filled with identical information, or with the three shift registers replaced by a single register.

In some embodiments of the present invention the rows of the sampling function $\phi_i$ are dynamically formed from the contents of a memory buffer using shift registers. There are three different sampling function rows active at any time. Sampling function shift register 321, which contains $\phi_{i,1,k}$, provides the output control signals for all pixels in columns $\{1, 4, 7 \ldots\}$. Sampling function shift register 322, which contains $\phi_{i,2,k}$, provides the output control for all pixels in columns $\{2, 5, 8 \ldots\}$. Sampling function shift register 323, which contains $\phi_{i,3,k}$, provides the output control signals for all pixels in columns $\{3, 6, 9 \ldots\}$. In some embodiments of the present invention the sampling function storage buffer 300 is a digital memory buffer holding pixel controls signals, each pixel control signal consisting of 2-bits representing which, if any, of the two current output lines to be selected. In some embodiments the digital memory holding the control signals is accessed as words of 2(m)-bits in length, where m≥2(supp($\psi$)). In some embodiments of the present invention m=16≥2(support($\psi$)) and the memory data width is 32-bits.

To dynamically generate a new row i of the sampling functions, the image sensor of FIG. 3 copies 3 words from storage buffer 300 into shift register input buffers 311,312, 313 then causes the contents of the input buffers 311,312, 313 and the shift registers 321,322,323 to jointly shift m places. In some embodiments the sampling function shift registers 321,322,323 further comprise an $N_1$ element long shadow register to provide a means to maintain the state of the pixel control signals applied to pixel array 301 while the next shift operation occurs. In some embodiments of the present invention sampling function memory buffer 300 is accessed in a cyclical pattern such that the process of filling shift registers 321,322,323 with the first row need only be performed once, on power-up initialization.

Subsequent to initialization, new rows of the sampling function are formed and applied to pixel array 301 for each cycle of the shift register, thereby causing two new current output signals per column, indicative of the summation of selected pixels outputs, to form on the inputs of current comparator array 340. The two current outputs signals of a column are compared to form a 1-bit value that is representative of their relative magnitude. Column output bits, taken together, represent one row of digital output, and form a row vector of a measurement of image intensity signals on the image sensor pixels of the pixel array. Rows of digital output are multiplexed by multiplexer 302 into smaller words to form a digital output stream.

In operation M rows of 3 different sampling functions are generated for every frame time t to form a measurement matrix $Y_t$, in some embodiments consisting of M-bits for each of the $N_2$ columns of the pixel array. In accordance with FIGS. 2a and 2b, each bit of the measurement matrix $y_{i,j}$ can be thought of as the sign of the vector product of one column of the pixel array $x_{j,t}$ and one row of one of the sampling functions $\phi_{i,h,k}$, as previously explained with respect to FIG. 2b.

As noted earlier, one effect of the sign($\cdot$) quantization used in the forgoing equation is that the measurement is generally incapable of encoding the DC coefficient of the spatial frequencies present in the image signal. For this reason some embodiments of the present invention provide for multiple rows of dark pixels that can be configured to provide a prior known contribution to current output when selected by the sampling function. In this way we create an expectation that certain pixels in every column will have a known constant value in a fully recovered and properly scaled image signal. This allows for the computation of a scale factor, for each column, that can be derived from the ratio of the expected value to the reconstructed signal value. Multiple rows may be used because the noise in the reconstructed scale coefficient, which must be relatively low to avoid amplifying noise in the rescaling calculation, is reduced by a factor proportional to the square root of the number of rows carrying the scale information.

Figure 4:
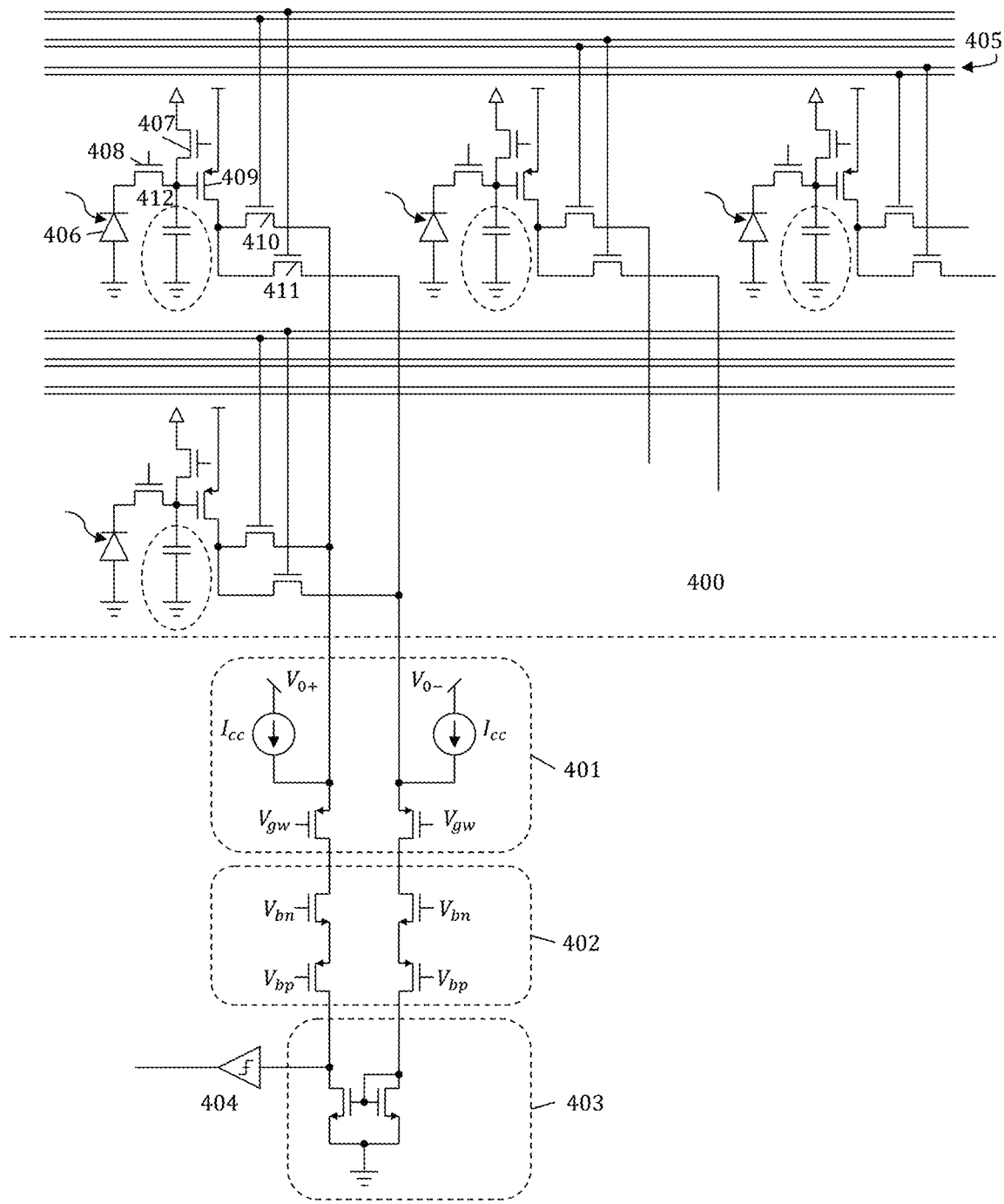
FIG. 4 is a circuit diagram showing more detailed aspects of an image sensor in accordance with aspects of the invention.

FIG. 4 is a circuit diagram showing more detailed aspects of portions of an image sensor in accordance with aspects of the invention. The portions of the image sensor of FIG. 4 are, in some embodiments, portions of the image sensor of FIG. 3. The embodiment of FIG. 4 includes a pixel array 400 (with only four elements of the pixel array shown for clarity), a current conveyor 401, a current limiter 402, a current mirror 403, a current comparator 404, pixel output control lines 405, a pinned photodiode 406, a reset transistor 407, a transfer gate 408, a transconductor 409, output select transistors 410, 411 and floating diffusion node 412.

In some embodiments each pixel comprises the pinned photodiode 406. The pinned photodiode can be reset through reset transistor 407, allowed to accumulate photo-generated electric charge for an exposure period, with the charge transferred to the floating diffusion node 412 through transfer gate 408 for temporary storage. The voltage at the floating diffusion node $V_{FD}$ controls tranconductor 409 to provide a current source that is proportional to the voltage signal. Depending on the state of pixel control lines 405, the current from a pixel can be switched through transistors 410 or 411 to one of two current output lines shared by all the pixels on a column. Conceptually, the column output currents represent the simple sum of the currents from selected pixels, but in practice there are additional factors. A more realistic estimate include offset and gain error introduced by readout circuitry blocks and the non-linearity error introduced by transconductor 409, as follows:

$$y_{i,j} = \text{sign}\left(\sum_{i=1}^{N_1} \phi_i(aV_{FD}(i,j)^2 + bV_{FD}(i,j) + c)\right)$$

where a, b and c are the coefficients of the second order adjustment for $I=f(V_{FD})$, $V_{FD}$ being the voltage stored in the floating diffusion 412 of a pixel. The coefficients depend on the operation point of the transistor ($V_{dd}$, $V_{0+}$ and $V_{0-}$). Although the coefficients a, b and c are approximately equal for all pixels, some mismatch may need to be considered.

Voltages $V_{0+}$ and $V_{0-}$ of each column are fixed using both current conveyors. In some embodiments the current conveyor is based on a single PMOS transistor, where.

$$V_{0-} = V_{gw} + V_t + \sqrt{\frac{I_{CC} + I_-}{\beta}}$$

and $$V_{0+} = V_{gw} + V_t + \sqrt{\frac{I_{CC} + I_+}{\beta}}$$

Current conveyor 401 is biased with a current $I_{cc}$ to ensure the minimum speed necessary to fulfill the settling requirements. The positive and negative branches are balanced using a current mirror 403 and the sign is obtained using current comparator 404. A current limiter 402 is included to avoid break-off problems caused by image columns having an excessive number of bright pixels driving the column output lines.

Another aspect of the present invention is that rows of the measurement $Y_t$ may, in some embodiments, be formed concurrently with the temporal development of the image signal $X_t$ such that each row vector of the measurement $Y_t$ is representative of the instantaneous state of the image signal $Z_t$ as it is integrated in the pixels of the image sensor over the time interval between pixel reset and sampling. In most embodiments each element $y_{i,j}$ of the measurement Y is, effectively, normalized by the sign(·) function. However, given the relationship between signal and measurement vectors, as explained in the background of the invention, the measurement Y may be conceptualized as being based on the summation of M normalized signal vectors, as in the following:

$$y_{j,t} \sim \Phi \sum_{k=1}^{M} \frac{x_{j,t_k}}{\|x_{j,t_k}\|_2}$$

The conceptual formulation above suggests that the elements of the columns vectors of $Z_t$ will tend to preserve their relative relationship, in terms of magnitude, even after the intrinsic signal storage devices of the image sensor have become saturated. This behavior may be intuitively understood from the fact that some finite percentage of the measurement $Y_t$ is generated over a period of time when pixels of the image sensor are still operating in their linear range.

Figure 8:
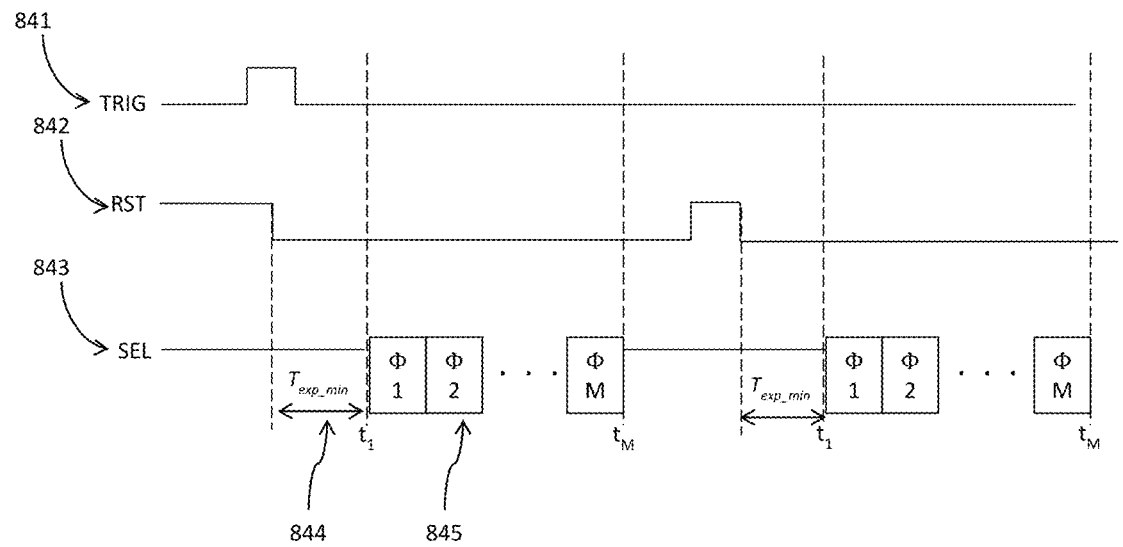
FIG. 8 is a timing diagram illustrating high sensor dynamic range acquisition in accordance with aspects of the invention.

FIG. 8 is a timing diagram illustrating extended dynamic-range acquisition in accordance with aspects of the invention. The timing diagram includes a trigger signal TRIG, 841, a reset signal RST, 842, and a selection signal SEL, 843. Once the photo-diode is reset, if the transfer gate of the photo-diode is kept active during M samples of a certain image, each vector of the sampling matrix Φ is applied to image signals associated with progressively higher exposure time.

The trigger signal indicates beginning of acquisition of images by a sensor. The reset signal resets floating diffusion nodes of pixels in the sensor. The selection signal selects output of selected pixels of the sensor. As illustrated in FIG. 8, the selection signal obtains M samples from various selected pixels, beginning at time $t_1$ and continuing to time $t_m$, 845. Time $t_1$ is generally somewhat after the reset signal goes low, to allow for sufficient exposure time, and hence charge accumulation time, for the pixel to obtain a valid response. This time requirement is denoted as the $T_{exp\_min}$, minimum exposure time, 844. The pixels remain exposed during the period from $t_1$ to $t_m$. Hence, generally during each succeeding sampling time, from 1 to m, the pixels have increased duration of exposure, effectively, increasing dynamic range of the sensor.

In some embodiments obtaining of sample and accumulation of charge may occur synchronously, for example as illustrated in the timing diagram of FIG. 8, with M samples for a measurement being obtained between applications of the reset signal. In other embodiments, obtaining the M samples for a measurement may be interrupted, with the reset signal applied during the period in which the M samples are obtained, and the charge accumulation period may be asynchronous to the period during which samples for a measurement are obtained.

Figure 5:
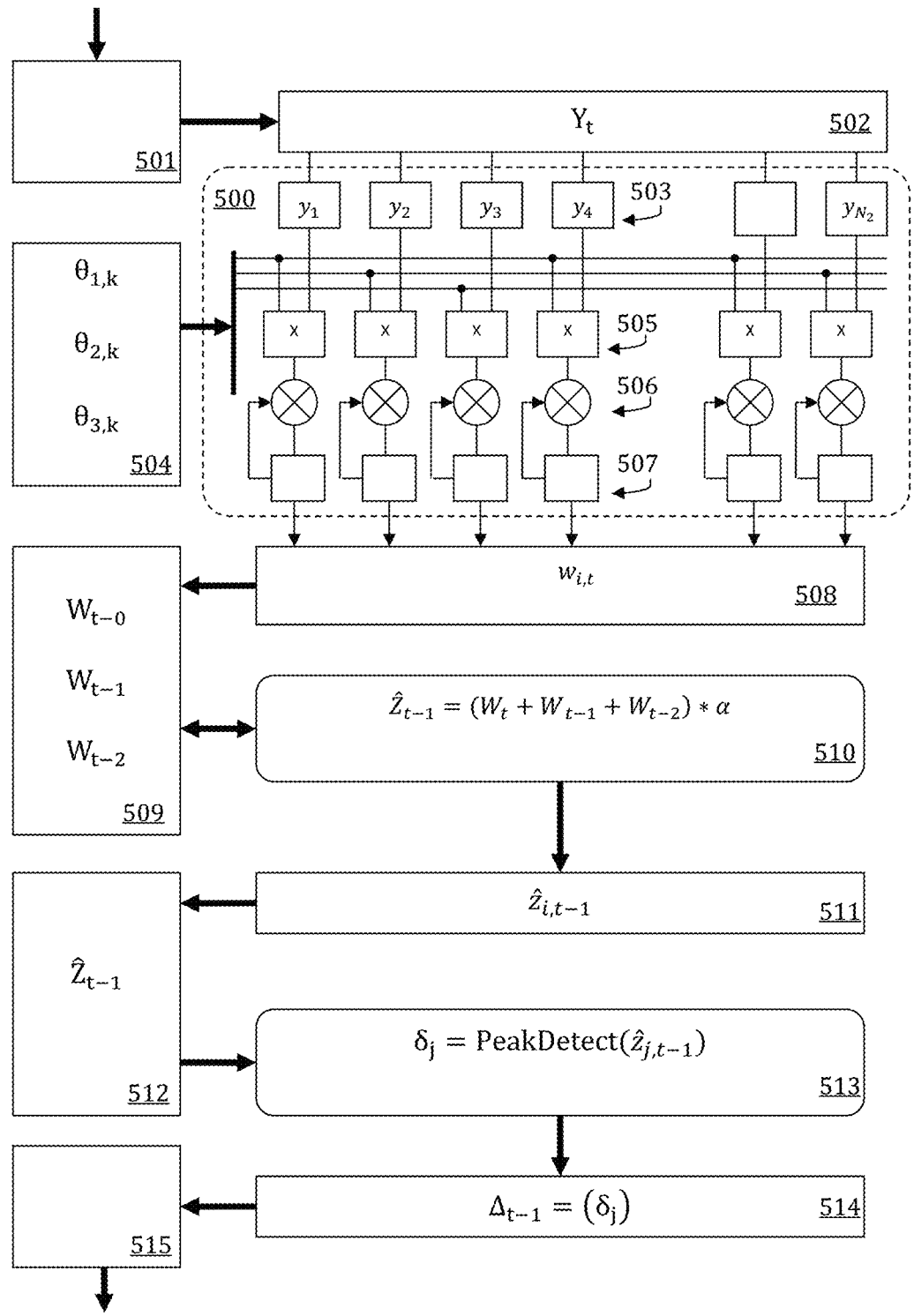
FIG. 5 is a block diagram of a processing architecture consistent with certain aspects of the present invention.

In some implementations of the present invention a parallel processing device, having architecture similar to that shown in FIG. 5, is provided to process the measurement stream. FIG. 5 is a block diagram of a processing architecture consistent with aspects of the present invention.

FIG. 5 includes measurement input buffer 501; measurement processing buffer 502; basis function buffer 504; matrix multiplier 500 including: measurement register 503, multipliers 505, summing junctions 506, and accumulation registers 507. Also included in the processor of FIG. 5, partial sum register 508; partial sum buffer 509; signal averaging processor 510; signal reconstruction row register 511; signal reconstruction row buffer 512; peak detection processor 513; signal parameter register 514 and output buffer 515.

In operation an incoming measurement stream is written to measurement input buffer 501. When a full frame-time measurement $Y_t$ is available in input buffer 501 it is transferred to measurement processing buffer 502. In the implementation considered here, rows of measurement bits are transferred from measurement buffer 502 to measurement processing buffer 503 one row at a time for processing. To form each element of $w_{i,t}$ in buffer 508, each bit of each column $y_j$ of the measurement Y in buffer 502 is multiplied by the corresponding bit of one column vector $\theta_{j,h,k}$ as follows:

$w_{i,j,t} = \sum_{l=1}^{M} \theta_{l,i,h,k} y_{l,j,t}$, where $h=j\%3+1$ and $k=t\%3+1$ The reconstructed signal row vector $\hat{z}_{i,t-1}$ in register 511 is formed in signal averaging processor 510 by summing $w_{i,t}$, the output of matrix multiplier 500, with the corresponding row from the two previous frame times $w_{i,t-1}$ and $w_{i,t-2}$, then convolving by the kernel α, as previously explained with respect to FIG. 2a and FIG. 2b. Methods for the efficient implementation of such image averaging functionality will be well known to those skilled in the art of high-speed digital image processing.

Peak detection processor 513 processes rows of the reconstructed signal stored in buffer 512 by estimating the offset parameters associated with the points of intersection of the illumination plane with objects of interest. Recall the reconstructed signal $\hat{Z}$ is an estimate of the original image signal X processed by the spatial filtering function Ψ, which, in some implementations, is a central difference approximation of the first derivative of the image signal with respect to rows. Known methods for extracting offsets from such a filtered image signal Z=ΨX include steps of finding and sorting local minimums and maximums found on each column of the reconstructed image, pairing neighboring min/max pairs to find points-of-interest, sorting points-of-interest on each column in order of differential magnitude, and forming the offset coordinate vector $\Delta \in \{1, 2, 3 \ldots N_1\}^{P \times N_2}$ from the $P \times N_2$ row offset coordinates of those P points-of-interest. Additional steps may include interpolation to estimate sub-pixel parameters and pruning the set of coordinates to eliminate those point that are inconsistent with respect to a priori expectation relative to the surface of the object of interest. Methods for the efficient implementation of such peak detection functionality will be well known to those skilled in the art of machine-vision.

In some embodiments, a more accurate approximation of the signal Z can be formed based on the basis function Θ and the measurement Y.

Figure 7:
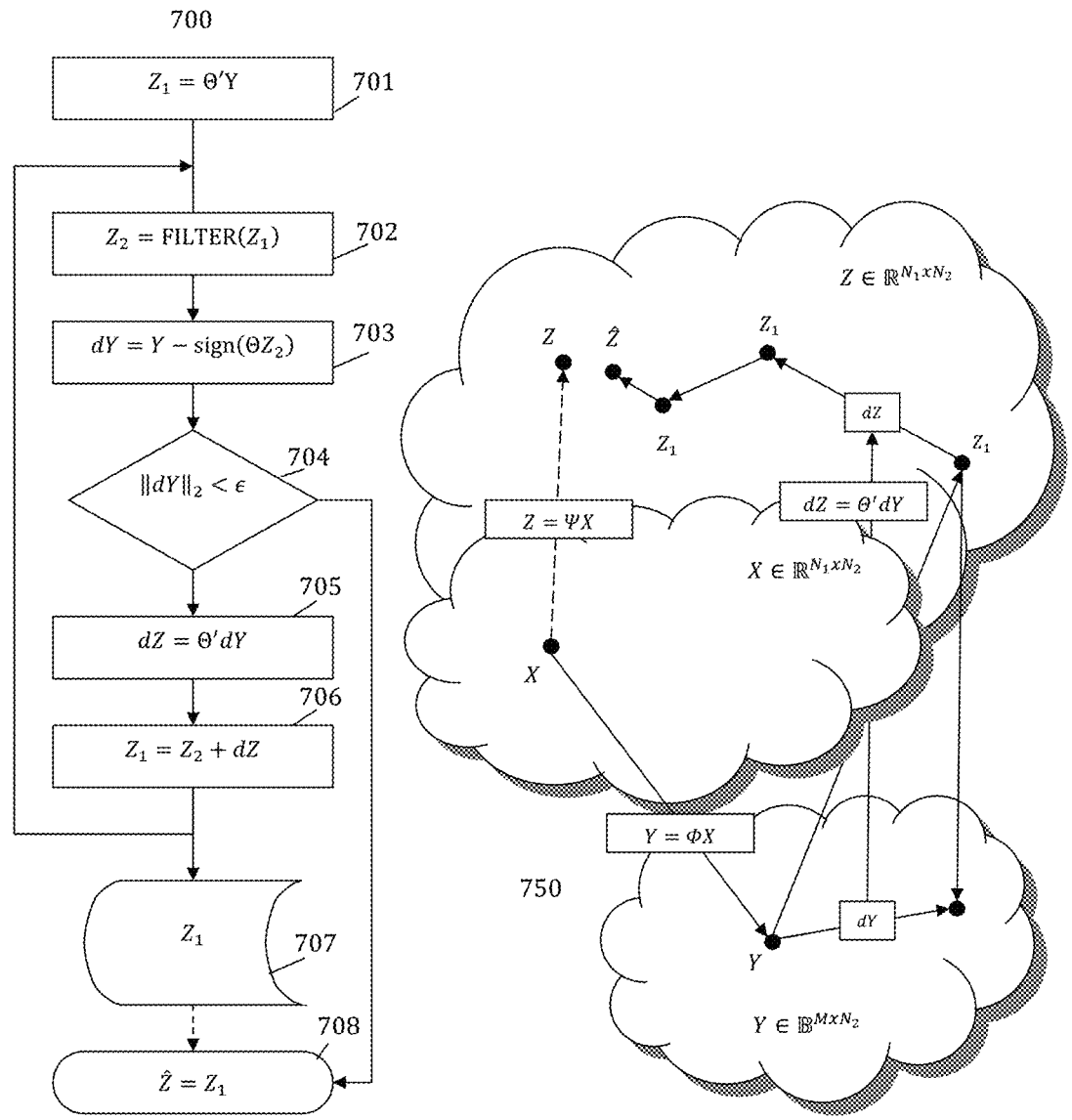
FIG. 7 is a diagram illustrating a method of forming approximations of an image signal in accordance with aspects of the invention.

FIG. 7 is a diagram showing a method for successively forming more accurate approximations of the image signal $\hat{Z}$. FIG. 7 includes flowchart 700 and explanatory illustration 750. Flowchart 700 includes: 701 initializing the reconstructed image buffer, 702 spatially filtering the reconstructed image, 703 computing a reconstruction error, 704 testing the reconstruction error, 705 computing a signal gradient, 706 forming a new reconstructed image in storage buffer 707, and 708 reading the final result from storage buffer 707.

The reconstruction method of flowchart 700 can be explained with the aid of illustrative drawing 750 as follows:

701. The original measurement vector Y is transformed from the measurement space to signal space to form a first approximation of the signal $Z_1$.

702. The first approximation of the signal $Z_1$ is filtered to form a second approximation $Z_2$ (not shown). The filtering comprising linear or nonlinear transformation of the signal intended to preserve the relevant information of the signal, while attenuating noise of the reconstruction.

703. The second approximation $Z_2$ is transformed back in to the measurement domain to form a second measurement vector that is subtracted from the original measurement vector Y to form a measurement gradient dY.

704. If the magnitude of the measurement gradient $\|dY\|_2$ is sufficiently small, the current first approximation of the signal $\hat{Z}=Z_1$ is reported as the best approximation of the signal Z.

705. Failing 704, the measurement gradient dY is transformed into signal space to form a signal gradient dZ.

706. The signal gradient dZ is added to the second approximation of the signal $Z_2$ to create a new first approximation of the signal $Z_1$ and the reconstruction process returns to step 702.

The method of flowchart 700 is based on a priori knowledge of the image signal Z, specifically the knowledge that the information content is small as compared to the dimension of the signal. The first approximation of the signal, as computed in 701, is assumed to comprise a sparse signal plus sampling noise and other noise assumed to increase the complexity. The filtering process of 702 is designed to restrict the signal approximation to the level of information content or sparseness that is anticipated in the original signal. Although the second signal approximation may have the same sparseness as the original signal, there is no guaranteed that it is actually close enough to the original signal to represent a sufficiently accurate approximation. Since the original signal Z is unknown there is no direct way to test the accuracy of the approximation $Z_2$. However, there is an indirect method, and that is to transform the approximation of the signal back into measurement space and compute the distance to the measurement vector, the measurement vector being known exactly. Since there is a known relationship between distance in measurement space and distance in signal space (as explained in the background of the invention) it can be inferred, from the gradient vector in measurement space, a gradient vector in signal space that, in effect, points in the direction of the original signal. By adding the signal gradient vector to the current approximation we form a new signal approximation that is closer to the original signal. The forgoing process of filtering, forming and applying gradients may be iterated until the measurement vector formed from the filtered image is sufficiently close to the actual measurement vector or until the gradient vector formed in the measurement space ceases to get smaller, indicating that the accuracy limits of the sampling function has been exceeded.

In the compressive sensing literature known methods similar to the above include BIHT (Binary Hard Thresholding), named in reference to the process of filtering the reconstructed signal by a method of zeroing all but K coefficients, where K is the known sparseness of the signal in a specific basis. Although this method of filtering may be effective, in practice it can be difficult to implement efficiently. In some applications, a simple median filter applied to $Z_1$ may fill the same role as more complicated methods of coefficient truncation, but it is more easily implemented and it does not depend on accurate knowledge of the sparseness K of the original image signal or the knowledge of (or a search for) a maximally compressive basis in which to apply the threshold process.

Although the invention has been discussed with respect to various embodiments, it should be recognized that the invention comprises the novel and non-obvious claims supported by this disclosure.

What is claimed is:

1. A processing device for processing a binary measurement signal, the processing device comprising:

a first buffer to receive the binary measurement signal read out from a pixel array with $N_1$ rows and $N_2$ columns, wherein the binary measurement signal corresponds to an optical image formed at the pixel array, wherein the binary measurement signal has been read out from the pixel array as a matrix with M rows and $N_2$ columns, where M is smaller than $N_1$, by sampling analog column output signals representative of the optical image and formed on columns of the pixel array based on a sampling matrix factored as a product of (i) a sparse random matrix with M rows and $N_1$ columns and (ii) a spatial filtering function corresponding to a partial first derivative with respect to the rows of the pixel array;

a second buffer to store the sparse random matrix;

first digital processing circuitry arranged and configured to perform a sparse matrix multiplication of a transposed instance of the sparse random matrix with the binary measurement signal;

second digital processing circuitry arranged and configured to convolve a result of the sparse matrix multiplication with a smoothing kernel, that is related to the spatial filtering function corresponding to the partial first derivative with respect to the rows of the pixel array, to obtain a $N_1 \times N_2$ digital image corresponding to the optical image effectively filtered with the spatial filtering function corresponding to the partial first derivative with respect to the rows of the pixel array; and a third buffer to store the digital image for transmission, display or further processing.

2. The processing device of claim 1, comprising:

a third digital processing circuitry arranged and configured to determine peaks in columns of the obtained digital image; and calculate offset parameters associated with points of interest in the optical image based in the determined peaks.

3. The processing device of claim 1, wherein the first digital processing circuitry comprises:

an array of multipliers arranged and configured to receive a row of the binary measurement signal from the first buffer, and multiply the row with a corresponding coefficient of a row of the transpose instance of the sparse random matrix;

an array of accumulation registers; and an array of adders arranged and configured to add values output by the array of multipliers to corresponding values accumulated in the array of accumulation registers from previous multiplications of other rows of the binary measurement signal with respective other coefficients of the row of the transpose, wherein a row of the digital image corresponding to the row of the transpose is formed as values accumulated in the array of accumulation registers after multiplications of all the rows of the binary measurement signal by all coefficients of the row of the transpose.

4. A vision system comprising:

a digital camera comprising a pixel array including a plurality of pixel elements partitioned into $N_1$ rows and $N_2$ columns, each of the pixel elements comprising a light sensor;

wherein the $N_2$ pixel elements in each of the $N_1$ rows have common control couplings for receiving control signals for pixel elements of that row, the common control couplings of each of the $N_2$ pixel elements include a first control coupling for receiving a control signal indicative of a first of two bits of information and a second control coupling for receiving a control signal indicative of a second of the two bits of information, wherein the control signals are coefficients of a sampling matrix factored as a product of (i) a sparse random matrix with M rows and $N_1$ columns, where M is smaller than $N_1$, and (ii) a spatial filtering function corresponding to a partial first derivative with respect to the rows of the pixel array;

wherein the $N_1$ pixel elements in each of the $N_2$ columns have common output couplings for providing each of a first analog column output signal on a first output coupling and a second analog column output signal on a second output coupling for that column, the first analog column output signal being dependent on light energy accumulated by two or more of the $N_1$ pixel elements of that column that are selectively coupled with respective first control couplings that have received respective control signals indicative of the first of the two bits of information, and the second analog column output signal being dependent on light energy accumulated by a different two or more of the $N_1$ pixel elements of that column that are selectively coupled with respective second control couplings that have received respective control signals indicative of the second of the two bits of information, the light energy accumulated on the $N_1 \times N_2$ pixel elements of the pixel array being from an optical image formed at the pixel array, wherein the two bits of information represent which, if any, of the first and second output couplings is to be selected; and an array of comparators coupled in one-to-one correspondence with the columns of the pixel array, each of the $N_2$ comparators to output a one-bit value that indicates whether or not a magnitude of the first analog column output signal is larger than a magnitude of the second analog column output signal from its corresponding column of the pixel array, the $N_2$ one-bit values output by the array of comparators being a row of a binary measurement signal, wherein the binary measurement signal corresponds to the optical image formed at the pixel array, the binary measurement signal being a matrix with M rows and $N_2$ columns; and a digital computer coupled with the digital camera via a digital communication channel, the digital computer comprising a processor and a memory device encoding instructions that, when executed by the processor, cause the digital computer to perform operations comprising receiving, on a row-by-row basis, the binary measurement signal from the digital camera;

performing a sparse matrix multiplication of a transposed instance of the sparse random matrix with the binary measurement signal;

convolving a result of the sparse matrix multiplication with a smoothing kernel, that relates to the spatial filtering function corresponding to the partial first derivative with respect to the rows of the pixel array, to obtain a $N_1 \times N_2$ digital image corresponding to the optical image effectively filtered with the spatial filtering function corresponding to the partial first derivative with respect to the rows of the pixel array; and outputting the digital image for transmission, display or further processing.

5. The vision system of claim 4, wherein the digital camera comprises a shift register coupled with the control couplings of the respective rows of the pixel array, wherein the shift register is configured to receive control signals that form a row of the sampling matrix, and provide the received control signals to the control couplings of the respective rows of the pixel array.

6. The vision system of claim 4, wherein the operations further comprise determining peaks in columns of the obtained digital image; and calculating offset parameters associated with points of interest in the optical image based in the determined peaks.

7. The vision system of claim 4, wherein the digital camera comprises a storage element associated with the control couplings of the rows, wherein the storage element comprises an array of storage cells, each of the storage cells including storage for the two bits of information representing the control signals.

8. The vision system of claim 7, wherein the digital camera comprises a shift register having an input coupled with the storage element and outputs coupled in one-to-one correspondence with the control couplings of the respective rows of the pixel array, wherein the shift register is configured to receive a number of control signals stored in the storage element that is equal to the number of rows of the pixel array, and provide the received control signals to the control couplings of the respective rows of the pixel array.

9. The vision system of claim 8, wherein the digital camera comprises an input buffer having an input coupled to the storage element and an output coupled to the shift register, wherein the input buffer is configured to transfer the control signals from the storage element to the shift register in subsets of the number of control signals.

10. The vision system of claim 9, wherein the shift register is configured to retain previously received control signals while new control signals are being transferred by the input buffer from the storage element to the shift register, thereby maintaining a state of the control couplings while new control signals are being transferred to the shift register.

11. The vision system of claim 4, wherein the digital camera comprises:
a first storage element disposed adjacent one side of the pixel array for storing information representing the control signals; and
a second storage element disposed adjacent another side of the pixel array for storing a copy of the information representing the control signals.

12. The vision system of claim 4, wherein the light sensor of at least some of the pixel elements comprises a pinned photodiode.

13. The vision system of claim 4, wherein
each of the pixel elements comprises
a transconductor, and
a floating diffusion node coupled with the light sensor and the transconductor, the floating diffusion node configured to store charge accumulated by the light sensor, such that a voltage of the floating diffusion node causes the transconductor to provide a pixel current proportional to the voltage.

14. The vision system of claim 13, wherein
each of the pixel elements comprises
a first transistor coupled with the transconductor, the control coupling of the corresponding row, and the first output coupling of the corresponding column, and
a second transistor coupled with the transconductor, the control coupling of the corresponding row, and the second output coupling of the corresponding column,
the first transistor and the second transistor are arranged and configured to switch the pixel current provided by the transconductor to
the first output coupling if the control coupling has received a control signal indicative of the first of the two bits of information, thereby the pixel current to contribute to the first analog column output signal on the first output coupling, and
the second output coupling if the control coupling has received a control signal indicative of the second of the two bits of information, thereby the pixel current to contribute to the second analog column output signal on the second output coupling.

15. The vision system of claim 4, wherein the digital camera comprises:
an output data multiplexer coupled through 1-bit digital output signal lines with respective outputs of the comparators, wherein the output data multiplexer is configured to output the row of the binary measurement signal.

* * * * *